United States Patent
Toda

(10) Patent No.: US 9,287,314 B2
(45) Date of Patent: Mar. 15, 2016

(54) SOLID-STATE IMAGING DEVICE, LIGHT DETECTING DEVICE, AND ELECTRONIC APPARATUS

(71) Applicant: Sony Corporation, Tokyo (JP)

(72) Inventor: Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/569,248

(22) Filed: Dec. 12, 2014

(65) Prior Publication Data

US 2015/0179845 A1    Jun. 25, 2015

(30) Foreign Application Priority Data

Dec. 19, 2013   (JP) ................................. 2013-262101

(51) Int. Cl.
*G01J 5/20* (2006.01)
*H01L 27/146* (2006.01)
*H01L 31/0352* (2006.01)
*H01L 31/109* (2006.01)

(52) U.S. Cl.
CPC .... *H01L 27/14649* (2013.01); *H01L 27/14696* (2013.01); *H01L 31/035209* (2013.01); *H01L 31/109* (2013.01); *H01L 27/14683* (2013.01)

(58) Field of Classification Search
CPC ................. H01L 31/035236; H01L 27/14649; H01L 31/035218
See application file for complete search history.

(56) References Cited

U.S. PATENT DOCUMENTS

| | | | | |
|---|---|---|---|---|
| 5,313,073 A | * | 5/1994 | Kuroda et al. | 257/18 |
| 5,882,952 A | * | 3/1999 | Kizuki et al. | 438/47 |
| 6,642,537 B1 | * | 11/2003 | Gunapala et al. | 257/21 |
| 2002/0117658 A1 | * | 8/2002 | Bandara et al. | 257/14 |
| 2012/0056153 A1 | * | 3/2012 | Saito et al. | 257/13 |
| 2013/0333751 A1 | * | 12/2013 | Norman | 136/255 |
| 2015/0115299 A1 | * | 4/2015 | Grundmann et al. | 257/96 |

FOREIGN PATENT DOCUMENTS

JP          04130687 A  *  5/1992   ............... H01S 3/18
JP     2011-222874 A     11/2011

OTHER PUBLICATIONS

Urbaszek et al., "Creating excitons in II-IV quantum wells with large binding energies," 2000, IEEE pp. 73-80.*
Li et al., "Novel grating coupled and normal incidence III-V quantum well infrared photodetectors with background limited performance at 77 K," 1994, Kluwer Academic Publishers, H.C. Liu et al. (eds.), Quantum Well Intersubband Transition Physics and Devices, pp. 29-42.*
A. Rogalski, "Quantum well photodetectors in infrared detector technology," 2003, Journal of Applied Physics, vol. 93, No. 8, pp. 4355-4391.*
Moiseev et al., "Mid-Infrared Lasers operating on a single quantum well at the Type II heterointerface," 2001, IEEE, pp. 534-535.*

* cited by examiner

*Primary Examiner* — Kiho Kim
(74) *Attorney, Agent, or Firm* — Sheridan Ross P.C.

(57) ABSTRACT

A solid-state imaging device includes a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light.

19 Claims, 24 Drawing Sheets

FIG. 2

| MATERIAL | Si | FeS$_2$ | ZnS | CuInGaS$_2$ | Gap |
|---|---|---|---|---|---|
| BAND GAP Eg(eV) | 1.11 | 0.95 | 3.8 | 1.8 | 2.2 |
| ELECTRON AFFINITY χ$_S$(eV) | 4.05 | 3.28 | 3.9 | 4.1 | 4.3 |
| LATTICE CONSTANT a(Å) | 5.431 | 5.404 | 5.4093 | 5.431 | 5.451 |
| LATTICE MISMATCH RATIO σ WITH Si SUBSTRATE (%) | — | −0.4971 | −0.3995 | 0 | 0.3682 |

FIG. 13

| MATERIAL | ELECTRON AFFINITY (eV) | BAND GAP (eV) |
|---|---|---|
| NiO | 1.5 | TO 4.0 |
| $Cu_2O$ | TO 3.4 | TO 2.1 |
| $ZnRh_2O_4$ | TO 2.3 | TO 2.2 |

SOLID-STATE IMAGING DEVICE, LIGHT DETECTING DEVICE, AND ELECTRONIC APPARATUS

CROSS REFERENCE TO RELATED APPLICATIONS

This application claims the benefit of Japanese Priority Patent Application JP 2013-262101 filed Dec. 19, 2013, the entire contents of which are incorporated herein by reference.

BACKGROUND

The present disclosure relates to a solid-state imaging device, a light detecting device, and an electronic apparatus, in particular, to a solid-state imaging device, a light detecting device, and an electronic apparatus for the detection of infrared light and for which it is possible to improve mass production and lower costs.

In recent years, there has been a demand for inexpensive detecting devices or image sensors having a sensitivity to infrared (IR) light from near infrared to mid-infrared with a wavelength of 1 μm or more. As a range of applications, there are surveillance cameras or vehicle cameras which are able to be used at night, detectors for preventing collisions which are also vehicle-mounted, medical or agricultural applications such as being able to detect amounts of moisture, and the like.

In an IR light image sensor, for example, there is a sensor with a photoelectric conversion section where an InGaAsSb based material is set to a Multi-Quantum Wells (MQW) structure on an InP substrate. Japanese Unexamined Patent Application Publication No. 2011-222874 describes imparting sensitivity to IR light of a longer wavelength by forming a superlattice (MQW) structure (Type II) of an InGaAs layer and a GaAsSb layer on an InP substrate and causing this to function as a photoelectric conversion section.

However, in the case of an InP substrate, the size of the InP substrate is as small as 2 to 3 inches and is not suited to mass production. In addition, in terms of cost, one substrate is expensive at tens of thousands of yen.

On the other hand, there are also sensors where an SiGe based material on an Si substrate which is able to increase the area at a low cost is set as a photoelectric conversion section.

SUMMARY

However, in the case of SiGe based material, with respect to the Si substrate, the absolute value of a lattice mismatch ratio is as large as several percent and it may sometimes not be possible to thicken the photoelectric conversion section. In addition, a compound semiconductor, which is substantially lattice matched with the Si substrate with an absolute value of the lattice mismatch ratio being less than 1%, has a band gap which is wide at 0.95 eV to 3.8 eV, and is not suitable for long wavelength infrared spectroscopy of 1.2 μm or more.

The present disclosure was created in consideration of such circumstances and may also be able to improve mass production and lower costs in the detection of infrared light.

According to an embodiment of the present disclosure, there is provided a solid-state imaging device including a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light.

The MQW structure may have a Type II hetero interface and a thickness of each layer is set so as to form an inter-sub-band transition.

The hetero interface may be formed of $FeS_2$ or $Fe(S_{1-X1}Se_{X1})_2$, ZnS or $ZnS_{1-X2}Se_{X2}$, $CuIn_{1-Y1}Ga_{Y1}S_2$ or $CuIn_{1-Y2}Ga_{Y2}(S_{1-X3}Se_{X3})_2$, or GaP or $GaP_{1-X4}N_{X4}$.

The hetero interface may apply compressive strain to $ZnS_{1-X2}Se_{X2}$ or $CuIn_{1-Y2}Ga_{Y2}(S_{1-X3}Se_{X3})_2$ by controlling a Se composition or may apply compressive strain to $GaP_{1-X4}N_{X4}$ by controlling the N composition so as to cancel out tensile strain of $FeS_2$ or $Fe(S_{1-X1}Se_{X1})_2$.

The hetero interface may apply tensile strain to $ZnS_{1-X2}Se_{X2}$ or $CuIn_{1-Y2}Ga_2(S_{1-X3}Se_{X3})_2$ by controlling the Se composition or a Ga composition or may apply tensile strain to $GaP_{1-X4}N_{X4}$ by controlling the N composition so as to cancel out the compressive strain of $Fe(S_{1-X1}Se_{X1})_2$.

An electron barrier layer which is provided on the surface side of the MQW structure and an electrode which is arranged on the electron barrier layer may be further provided.

The electron barrier layer may be formed using NiO, $Cu_2O$, or $ZnRh_2O_4$.

The thickness of the electron barrier layer may be 10 nm or more.

A hole barrier layer may be formed between the silicon substrate and the MQW structure or a hole barrier layer may be set by increasing the thickness of the first layer only on the silicon substrate side of the MQW structure.

The hole barrier layer may include any one of ZnS or $ZnS_{1-X2}Se_{X2}$, $CuIn_{1-Y1}Ga_{Y1}S_2$ or $CuIn_{1-Y2}Ga_{Y2}(S_{1-X3}Se_{X3})_2$, or GaP or $GaP_{1-X4}N_{X4}$, and the thickness thereof may be 10 nm or more. Here, X1, X2, X3, X4, Y1, and Y2 described above have a value of 0 or more to 1 or less. That is, $0 \leq X1, X2, X3, X4, Y1, Y2 \leq 1$.

An inclined substrate may be used as the silicon substrate.

The inclined substrate may be a substrate which is inclined in the <011> direction or a synthesis direction of <011> and <0-11>.

The solid-state imaging device may have a structure with separated pixels.

The structure with separated pixels may be created by forming grooves by etching a part between pixels of a photoelectric conversion section.

The structure with separated pixels may be created by setting a part between the pixels of the photoelectric conversion section to p+.

The structure with separated pixels may be created by increasing the resistance of a part between the pixels of the photoelectric conversion section using ion implantation.

The surface layer of the photoelectric conversion part may be p+.

According to another embodiment of the present disclosure, there is provided a light detecting device including a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light.

The MQW structure has a Type II hetero interface and a thickness of each layer may be set so as to form an inter-sub-band transition.

According to still another embodiment of the present disclosure, there is provided an electronic apparatus including a solid-state imaging device provided with a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light, an optical system which emits incident light to the solid-state imaging device, and a signal processing circuit which processes an output signal which is output from the solid-state imaging device.

In one embodiment of the present technique, there is provided a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light.

It is desirable to provide a device having sensitivity from near infrared to mid infrared. In particular, according to the present technique, it is possible to improve mass production and lower costs in the detection of infrared light.

Here, the effects described in the present specification are merely illustrative, the effects of the present technique are not limited to the effects which are described in the present specification, and there may be additional effects.

BRIEF DESCRIPTION OF THE DRAWINGS

FIG. 2 is a diagram which shows characteristics for each material which is used for a photoelectric conversion element;

FIG. 13 is a diagram which shows characteristics of materials which are candidates for barrier layer materials;

DETAILED DESCRIPTION OF EMBODIMENTS

Below, description will be given of forms (referred to below as embodiments) for realizing the present disclosure. Here, description will be given in the following order.

0. Schematic Configuration Example of a Solid-State Imaging Device
1. First Embodiment (an example of a basic solid-state imaging device of the present technique)
2. Second Embodiment (an example of a solid-state imaging device which has a structure with pixels separated by grooves)
3. Third Embodiment (an example of a solid-state imaging device which has a p+ structure with separated pixels)
4. Fourth Embodiment (an example of a solid-state imaging device which has a structure with pixels separated by increased resistance due to ion implantation)
5. Fifth Embodiment (an example of a solid-state imaging device which has a p+ structure with separated pixels using selection growth control)
6. Sixth Embodiment (an example of an electronic apparatus)

0. Schematic Configuration Example of a Solid-State Imaging Device

Schematic Configuration Example of a Solid-State Imaging Device

Figure 1:
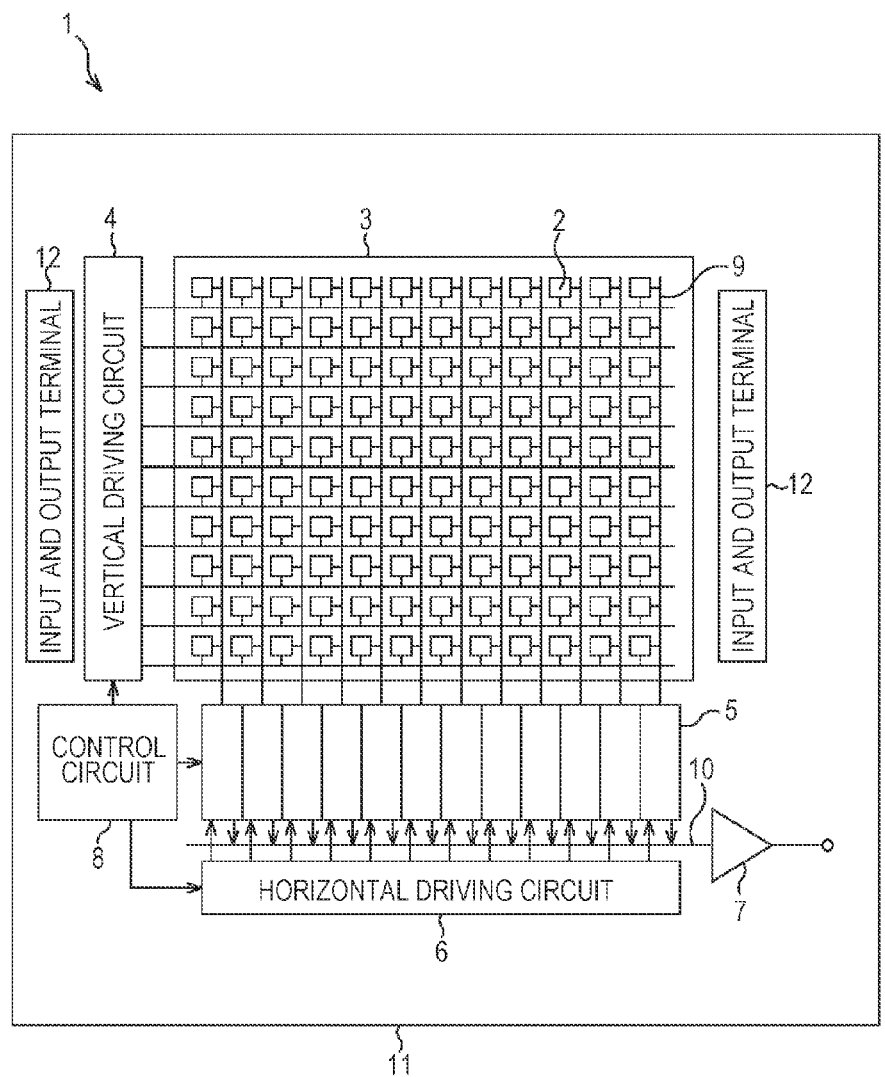
FIG. 1 is a block diagram which shows a schematic configuration example of a solid-state imaging device to which the present technique is applied.

FIG. 1 shows a schematic configuration example of one example of a Complementary Metal Oxide Semiconductor (CMOS) solid-state imaging device which is applied to each of the embodiments of the present technique.

As shown in FIG. 1, a solid-state imaging device (element chip) 1 is configured to have a pixel region (a so-called imaging region) 3 where pixels 2 which include a plurality of photoelectric conversion elements in a semiconductor substrate 11 (for example, a silicon substrate) are regularly arranged in a two-dimension manner, and a peripheral circuit section.

The pixels 2 are formed to have a photoelectric conversion element (for example, a photodiode) and a plurality of pixel transistors (so-called MOS transistors). The plurality of pixel transistors are able to be configured by three transistors which are, for example, a transfer transistor, a reset transistor, and an amplifier transistor and are also able to be configured by four transistors by further adding a selection transistor. Since the equivalent circuit of each of the pixels 2 (unit pixel) is a typical equivalent circuit, detailed description thereof will be omitted here.

In addition, it is also possible to set the pixels 2 to a common pixel structure. The structure common to the pixels is configured by a plurality of photodiodes, a plurality of transfer transistors, one floating diffusion, which is shared, and one each of other pixel transistors, which are shared.

The peripheral circuit section is configured by a vertical driving circuit 4, column signal processing circuits 5, a horizontal driving circuit 6, an output circuit 7, and a control circuit 8.

The control circuit 8 receives data which specifies an input clock, an operation mode, or the like and also outputs data such as internal information of the solid-state imaging device 1. In detail, the control circuit 8 generates a clock signal or a control signal which is a reference for operations of the vertical driving circuit 4, the column signal processing circuits 5, and the horizontal driving circuit 6 based on a vertical synchronizing signal, a horizontal synchronizing signal, and a master clock. Then, the control circuit 8 inputs these signals into the vertical driving circuit 4, the column signal processing circuits 5, and the horizontal driving circuit 6.

The vertical driving circuit 4 is configured by, for example, a shift resistor, selects pixel driving wiring, supplies a pulse for driving the pixels 2 to the selected pixel driving wire, and drives the pixels 2 in line units. In detail, the vertical driving circuit 4 sequentially selects and scans each of the pixels 2 in the pixel region 3 in line units in the vertical direction and supplies a pixel signal, which is based on a signal charge which is generated according to the amount of light received in the photoelectric conversion element of each of the pixels 2, to the column signal processing circuits 5 via the vertical signal line 9.

The column signal processing circuits 5 are arranged, for example, for each row of the pixels 2 and perform signal processing such as noise removal on signals, which are output from the pixels 2 in one line, for each pixel row. In detail, the column signal processing circuit 5 performs Correlated Double Sampling (CDS) for removing fixed pattern noise which is characteristic of the pixels 2 or signal processing such as signal amplification or Analog/Digital (A/D) conversion. At the output stage of the column signal processing circuit 5, a horizontal selection switch (which is not shown in the diagram) is provided to be connected between the horizontal signal lines 10.

The horizontal driving circuit 6 is configured by, for example, a shift resistor, selects each of the column signal processing circuits 5 in order by sequentially outputting a horizontal scanning pulse, and outputs a pixel signal from each of the column signal processing circuits 5 to the horizontal signal line 10.

The output circuit 7 performs signal processing with respect to a signal which is sequentially supplied from each of the column signal processing circuits 5 via the horizontal signal lines 10 and outputs the result. For example, there are also cases where the output circuit 7 only performs buffering and there are also cases where the output circuit 7 performs black level adjustment, row variation correction, various types of digital signal processing, and the like.

An input and output terminal 12 is provided for exchanging signals with the outside.

1. First Embodiment

Characteristics for Each Material which is Used for a Photoelectric Conversion Element FIG. 2 is a diagram which shows characteristics for each material which is used for a photoelectric conversion element of the pixel in FIG. 1.

As shown in FIG. 2, the band gap Eg(eV) of Si is 1.11, the electron affinity $\chi s(eV)$ is 4.05, and the lattice constant a (Å) is 5.431. The band gap Eg(eV) of $FeS_2$ is 0.95, the electron affinity $\chi s(eV)$ is 3.28, the lattice constant a (Å) is 5.404, and the lattice mismatch ratio σ with the Si substrate (%) is −0.4971.

The band gap Eg(eV) of ZnS is 3.8, the electron affinity $\chi s(eV)$ is 3.9, the lattice constant a (Å) is 5.4093, and the lattice mismatch ratio σ with the Si substrate (%) is −0.3995. The band gap Eg(eV) of $CuInGaS_2$ is 1.8, the electron affinity $\chi s(eV)$ is 4.1, the lattice constant a (Å) is 5.431, and the lattice mismatch ratio σ with the Si substrate (%) is 0. The band gap Eg(eV) of GaP is 2.2, the electron affinity $\chi s(eV)$ is 4.3, the lattice constant a (Å) is 5.451, and the lattice mismatch ratio σ with the Si substrate (%) is 0.3682.

Here, the electron affinity $\chi s(eV)$ represents energy from the vacuum level to the conduction band bottom end.

In recent years, there has been a demand for inexpensive detecting devices or image sensors having a sensitivity to infrared (IR) light from near infrared to mid-infrared with a wavelength of 1 μm or more. As a range of applications, there are surveillance cameras or vehicle cameras which are able to be used at night, detectors for preventing collisions which are also vehicle-mounted, medical or agricultural applications such as being able to detect amounts of moisture.

In an IR light image sensor, for example, there is a sensor with a photoelectric conversion section where an InGaAsSb based material is set to a Multi-Quantum Wells (MQW) structure on an InP substrate. However, the size of the InP substrate is as small as 2 to 3 inches and is not suited to mass production. In addition, in terms of cost, one substrate is expensive at tens of thousands of yen.

Thus, there are also sensors where an SiGe based material on an Si substrate which is able to increase the area at a low cost is set as a photoelectric conversion section. However, in the case of SiGe based material, the absolute value of the lattice mismatch ratio with respect to the Si substrate is as large as several percent and it may sometimes not be possible to thicken the photoelectric conversion section. In addition, a compound semiconductor which is substantially lattice matched with the Si substrate with an absolute value of the lattice mismatch ratio being less than 1% has, for example, a band gap which is wide at 0.95 eV to 3.8 eV, and is not suitable for long wavelength infrared spectroscopy of 1.2 μm or more as shown in FIG. 2.

Here, the definition of the lattice mismatch ratio is a lattice mismatch ratio $\sigma = \Delta a/a0 \times 100(\%)$ with respect to the lattice constant difference $\Delta a = a - a0$. In addition, a0 is the lattice constant of the Si substrate. Furthermore, here, it is possible to carry out lattice matching for the $CuInGaS_2$ with the Si substrate by controlling the composition ratio of In and Ga (composition ratio In:Ga=0.48:0.52). At this time, σ=0%.

Thus, in the present technique, gap narrowing is effectively carried out and an inter-sub-band transition is performed by creating an MQW structure which has a Type II hetero interface using a compound semiconductor material which is substantially lattice matched with the Si substrate. Detailed description will be given below.

Basic Configuration of Solid-State Imaging Device of the Present Technique

Figure 3:
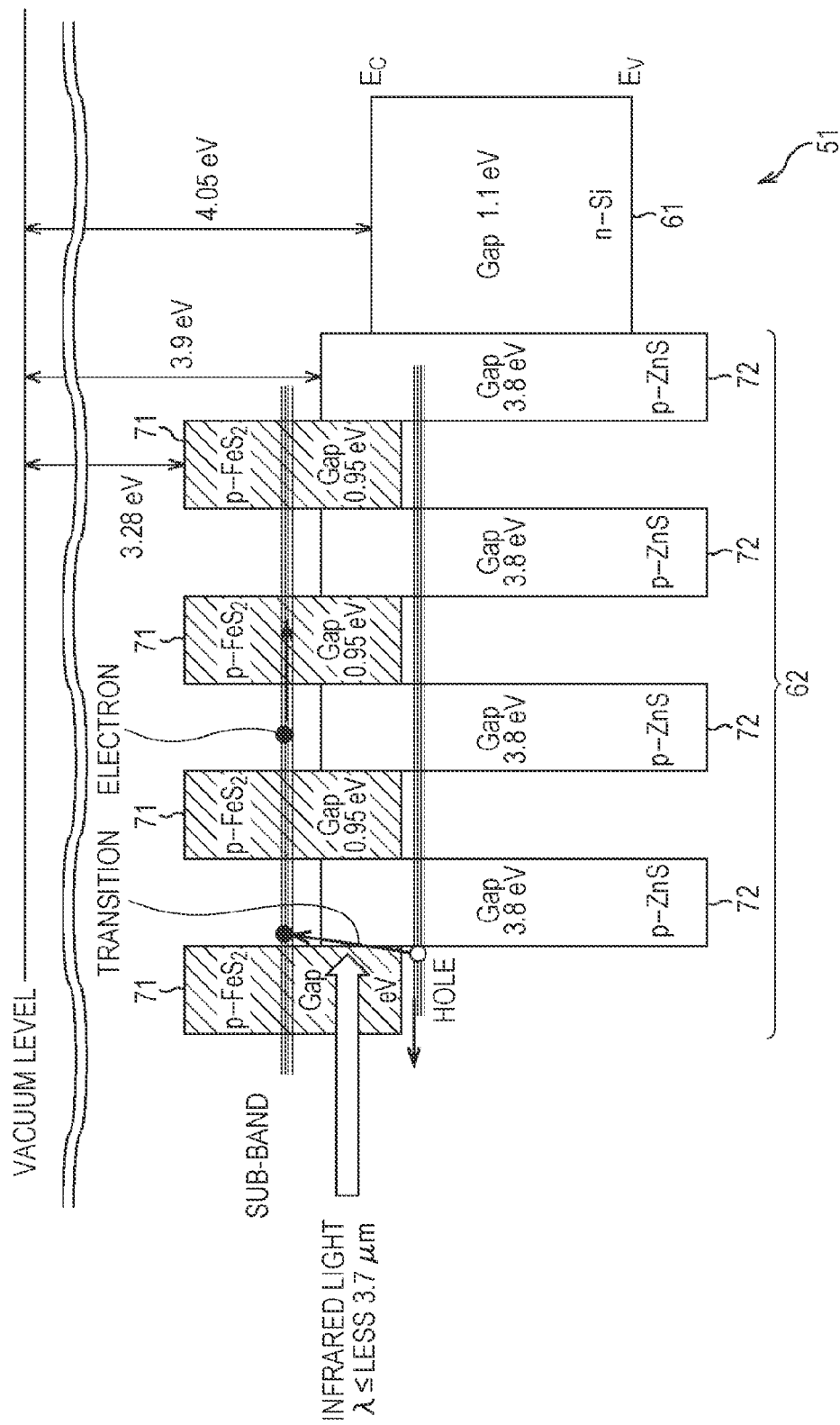
FIG. 3 is a cross sectional diagram which shows a configuration example of the solid-state imaging device to which the present technique is applied.

FIG. 3 is a cross sectional diagram which shows a configuration example of the solid-state imaging device to which the present technique is applied.

As shown in the example in FIG. 3, a photoelectric conversion section 62 is formed on an Si substrate 61 in a solid-state imaging device 51.

The photoelectric conversion section 62 is formed by an MQW structure which has a large number of Type II hetero interfaces. Here, Type II is a band structure where a well type potential is formed by a hetero interface. However, barrier layers and well layers thereof are separate layers which are not in common with respect to electrons and holes and the electrons and the holes are enclosed in separate layers. In a case of Type II, since a transition due to light absorption in a hetero interface is made possible by selecting two materials, it is possible to absorb light with a longer wavelength and effective gap narrowing is also possible.

In the example in FIG. 3, the photoelectric conversion section 62 has an MQW structure which has a large number of hetero interfaces between an FeS$_2$ layer 71 and a ZnS layer 72. In the MQW structure, a band structure as shown in FIG. 3 is formed from the electron affinity χs and the band gap energy Eg shown in FIG. 2 and the lattice matching condition is that the absolute value of the lattice mismatch ratio is substantially 1% or less.

That is, for the values of the Gap shown in the Si substrate 61, the FeS$_2$ layer 71, and the ZnS layer 72 in FIG. 3, each of the band gap energies Eg 1.1 eV, 0.95 eV, and 3.8 eV is respectively shown. In addition, for the electron affinity χs(eV) in the Si substrate 61, the FeS$_2$ layer 71, and the ZnS layer 72, 4.05 eV, 3.28 eV, and 3.9 eV are respectively shown with arrows from the vacuum level shown in the diagram.

Here, in the same manner, even with a combination of a FeS$_2$ layer and a CuInGaS$_2$ layer or a FeS$_2$ layer and a GaP layer, a Type II band structure is formed and the lattice matching condition is that the absolute value of the lattice mismatch ratio is substantially 1% or less.

Furthermore, by setting the thickness of each of the layers of the photoelectric conversion section 62, that is, of the MQW, to 10 nm or less, a carrier is able to move to the next well due to a tunnel effect and at this time, a sub-band with a large number of levels is formed as shown in FIG. 3. A carrier of an electron or a hole is able to move through this sub-band. At this time, the effect that a band gap is effectively narrowed is obtained due to the transition between the sub-bands, and as a result, as shown by an arrow on the left in the diagram, it is possible to absorb even mid-infrared IR light with a wavelength of λ to ~3.7 μm and it is possible to detect IR light with a long wavelength.

Here, for the purpose of reading out photoelectrons, the FeS$_2$ layer 71 and the ZnS layer 72 may be set as a P-type semiconductor and additionally, the Si substrate 61 may be set as a n-type semiconductor. Here, FeS$_2$ exhibits p-type conductivity when S is slightly excessive compared to the stoichiometric ratio. In addition, ZnS exhibits p-type conductivity as a result of doping N. By having such a structure, it is possible to read out electrons on the Si substrate 61 side via a sub-band and it is possible to discharge holes to the surface side via the sub-band.

Figure 4:
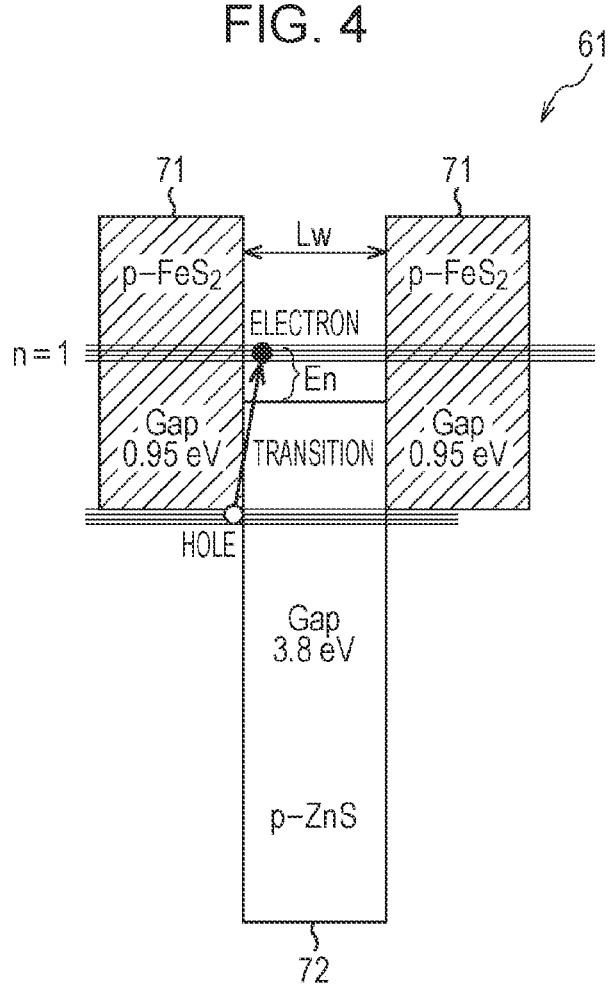
FIG. 4 is a diagram which shows energy En up to a quantum level from a bottom of a well.

Next, description will be given of being able to control an absorption wavelength by controlling the thickness of ZnS. Here, energy En to a quantum level is firstly obtained from the bottom of a well as shown in FIG. 4. En is represented in the following formula (1).

$$E_n = (h/2\pi)^2/(2m^*) \times (n\pi/L_w)^2 \quad (1)$$

Here, h is the Planck constant, m* is an effective mass of an electron, and Lw is the width of a well. It is understood from the formula (1) that En is increased and the quantum level is shifted to the high energy side when the well width Lw is narrowed.

Here, for the quantum level of holes on the valence band side of the FeS$_2$ layer, the thickness dependency of the quantum level is small since the effective mass of the holes is great. Accordingly, by setting the amount of change of En to be small, approximately 0 here, and controlling the thickness of ZnS, energy En to the quantum level is obtained from the bottom of the well of electrons on the conduction band side. Here, the ground level n=1. It is possible to estimate an absorption wavelength λ from the electron affinity χs, the band gap Eg and En of the FeS$_2$ and ZnS materials using the following formula (2).

$$E = Eg_{FeS2} - (\chi s_{ZnS} - \chi s_{FeS2}) + En$$

$$\lambda = c \times h/E \quad (2)$$

Here, c is a light speed. In addition, since $Eg_{FeS2} - (Xs_{ZnS} - Xs_{FeS2}) = 0.33$ eV, the longest absorption wavelength is ~3.7 μm. However, in practice, the absorption wavelength is shortened according to the amount of change due to the quantum level due to this.

Figure 5:
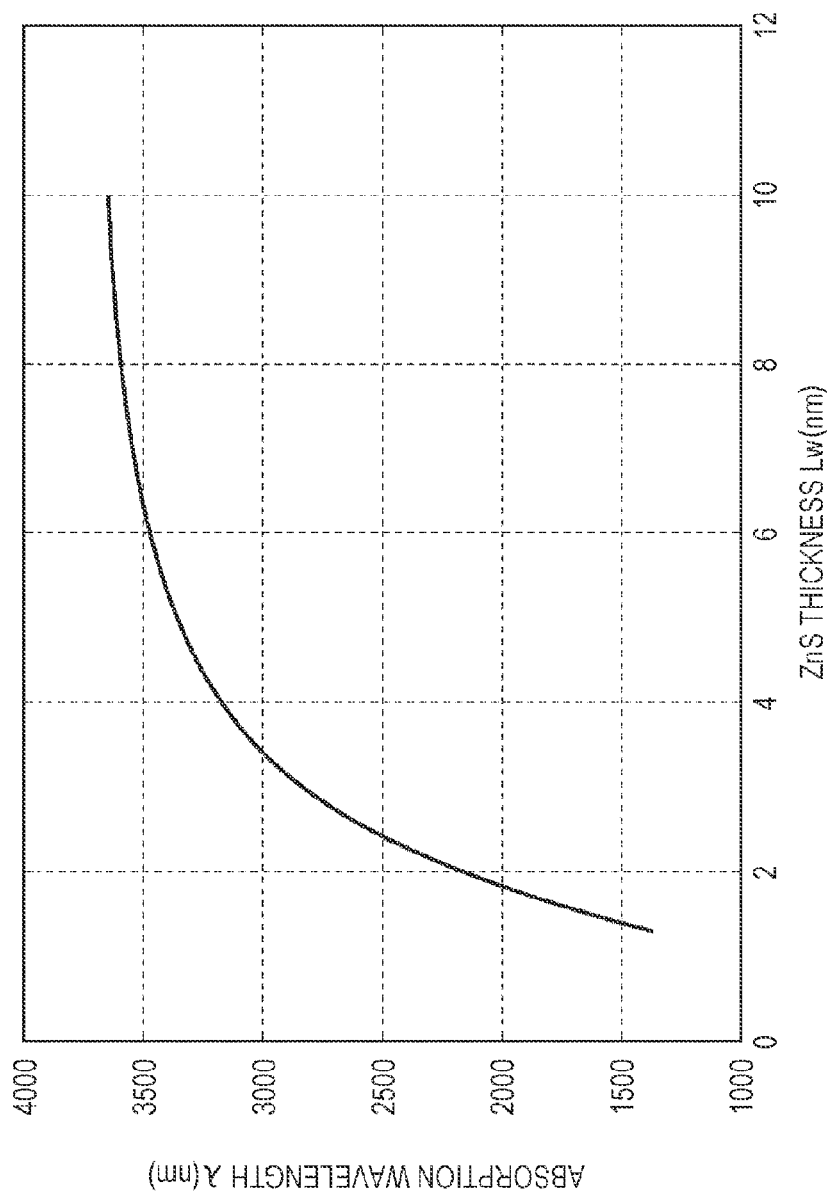
FIG. 5 is a diagram which shows results of estimating an absorption wavelength of an MQW structure which has a hetero interface of $FeS_2$ and $ZnS$.

FIG. 5 is a diagram which shows the results of estimating an absorption wavelength of an MQW structure which has a hetero interface of FeS$_2$ and ZnS under the premise described above. The horizontal axis represents a thickness Lw (nm) of the ZnS layer and the vertical axis represents an absorption wavelength λ (nm).

As shown in FIG. 5, it is possible to change the absorption wavelength from 1.5 μm to 3.7 μm by changing the thickness of the ZnS layer. That is, this has a meaning of having sensitivity from near infrared to a mid-infrared region.

However, although the short wavelength side is also absorbed when a wavelength is set to the long wavelength side, it is necessary to thicken the ZnS. At this time, the range is limited to a range where it is possible to form a sub-band.

Lattice Matching

Here, strictly speaking, lattice mismatching is slightly generated between the photoelectric conversion section 62 which is an MQW structure which has a hetero interface of FeS$_2$ and ZnS and the Si substrate 61. Accordingly, lattice matching may be carried out by adding Se.

Figure 6:
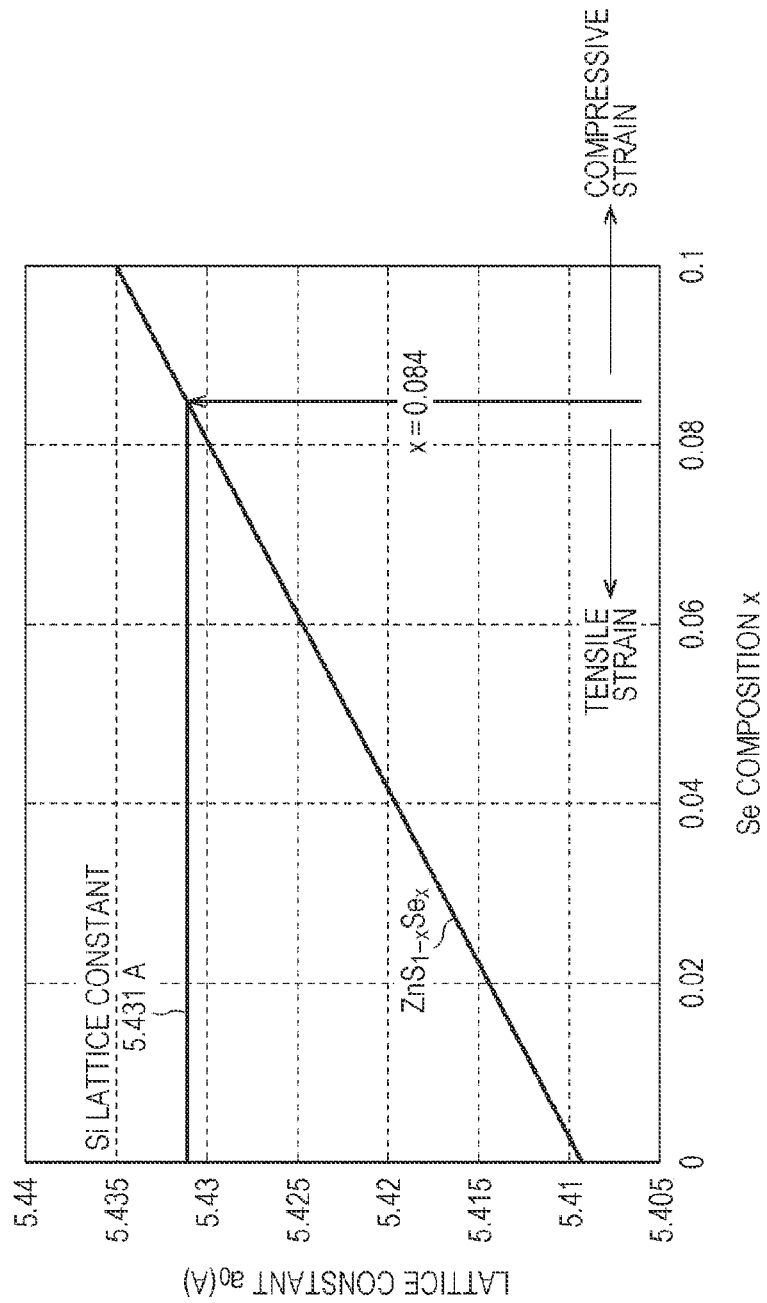
FIG. 6 is a diagram which shows a lattice constant of $ZnS_{1-x}Se_x$ with respect to a Se composition ratio x.

FIG. 6 is a diagram which shows a lattice constant of ZnS$_{1-X}$Se$_X$ with respect to a Se composition ratio x. Here, 0≤X≤1. Here, FIG. 6 is obtained using Vegard's law (a linear relationship) since the lattice constant of ZnSe is a=5.667 A.

As shown in FIG. 6, it is understood that, by setting the Se composition ratio x=0.084, the lattice constant of ZnS$_{1-X}$Se$_X$ matches the Si lattice constant a$_0$=5.431 A. That is, the Se composition ratio x=0.084 is a composition where ZnSSe is accurately lattice matched with the Si substrate. Here, the tensile strain and the compressive strain shown in the diagram show the strain of ZnS$_{1-X}$Se$_X$ due to deviation from the lattice matching conditions of the Si substrate. In the example in FIG. 6, the ZnS$_{1-X}$Se$_X$ layer has a tensile strain in a case where the Se composition is lower than the Se composition ratio X=0.084 of the lattice matching condition and, in contrast, the ZnS$_{1-X}$Se$_X$ layer has a compressive strain in a case where the Se composition is higher.

Figure 7:
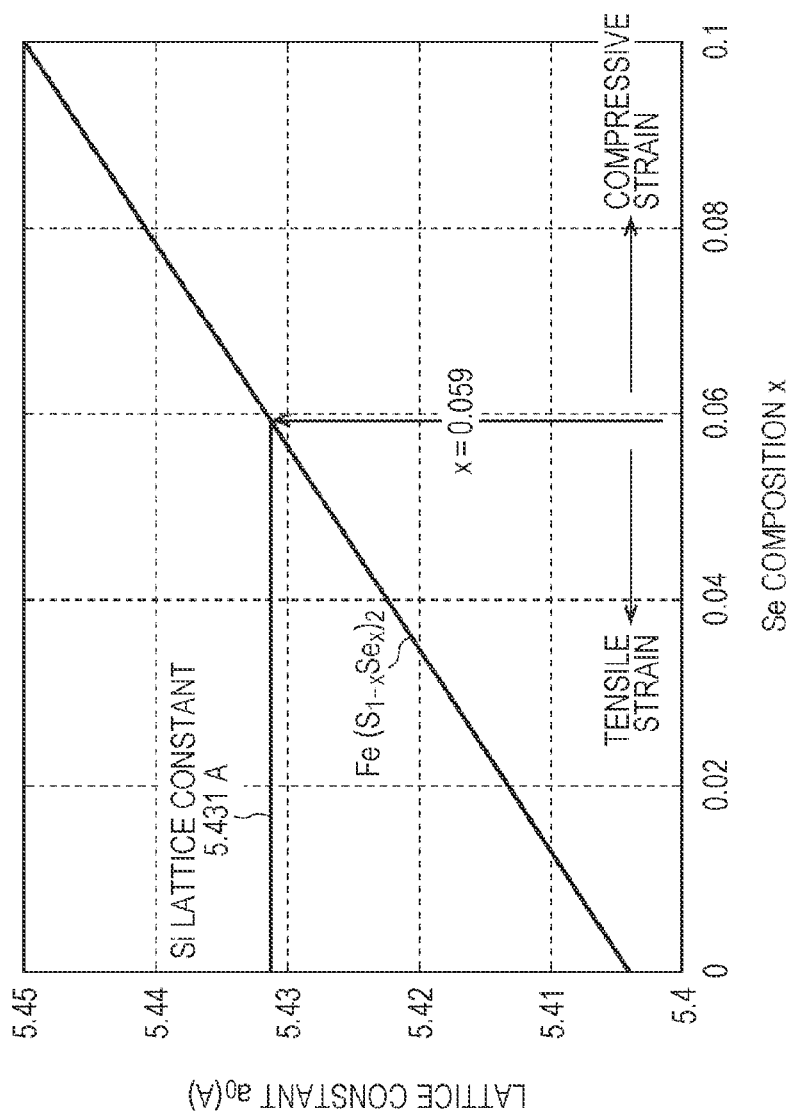
FIG. 7 is a diagram which shows a lattice constant of $Fe(S_{1-x}Se_x)_2$ with respect to the Se composition ratio x.

FIG. 7 is a diagram which shows a lattice constant of Fe(S$_{1-X}$Se$_X$)$_2$ with respect to the Se composition ratio x. Here, 0≤X≤1. Here, in FIG. 7, since the lattice constant of FeSe$_2$ is a=5.8633 A, the results were calculated using Vegard's law (a linear relationship).

As shown in FIG. 7, it is understood that, by setting the Se composition ratio x=0.059, the Fe(S$_{1-X}$Se$_X$)$_2$ lattice constant matches the Si lattice constant a$_0$=5.431 A. That is, the Se composition ratio x=0.059 is a composition where Fe(S$_{1-X}$Se$_X$)$_2$ is accurately lattice matched with the Si substrate.

From the above, it is possible to match the lattice constant with the Si substrate by adding Se, misfit dislocation is reduced, and it is possible to obtain a material with high crystallinity. Along with this, it is effective for dark current reduction which is an important characteristic of photoelectric conversion elements or image sensors.

Figure 8:
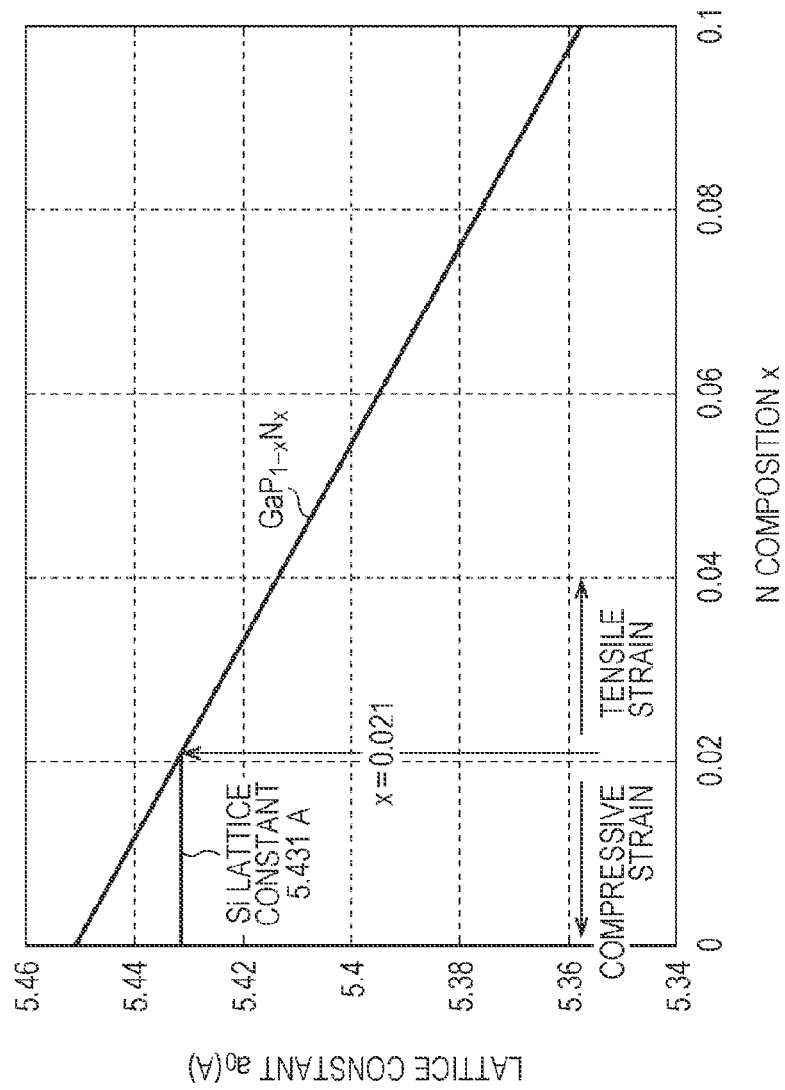
FIG. 8 is a diagram which shows a lattice constant of $GaP_{1-x}N_x$ with respect to an N composition ratio x.

FIG. 8 is a diagram which shows a lattice constant of $GaP_{1-x}N_X$ with respect to an N composition ratio x. Here, $0 \leq X \leq 1$. Here, since the lattice constant of GaN is a=4.52 A, the results in FIG. 8 were calculated using Vegard's law (a linear relationship).

As shown in FIG. 8, it is understood that, by setting the N composition ratio x=0.021, the lattice constant of $GaP_{1-x}N_X$ matches the lattice constant of Si $a_0$=5.431 A. That is, the N composition ratio x=0.021 is a composition which accurately lattice matches $GaP_{1-x}N_X$ with the Si substrate.

From the above, it is possible to match the lattice constant with the Si substrate by adding N, misfit dislocation is reduced, and it is possible to obtain a material with high crystallinity. Along with this, it is effective for dark current reduction which is an important characteristic of photoelectric conversion elements or image sensors.

Reduction in Lattice Strain

Here, it is possible to remove strain throughout the MQW by alternately laminating a layer with a tensile strain and a layer with a compressive strain.

Figure 9:
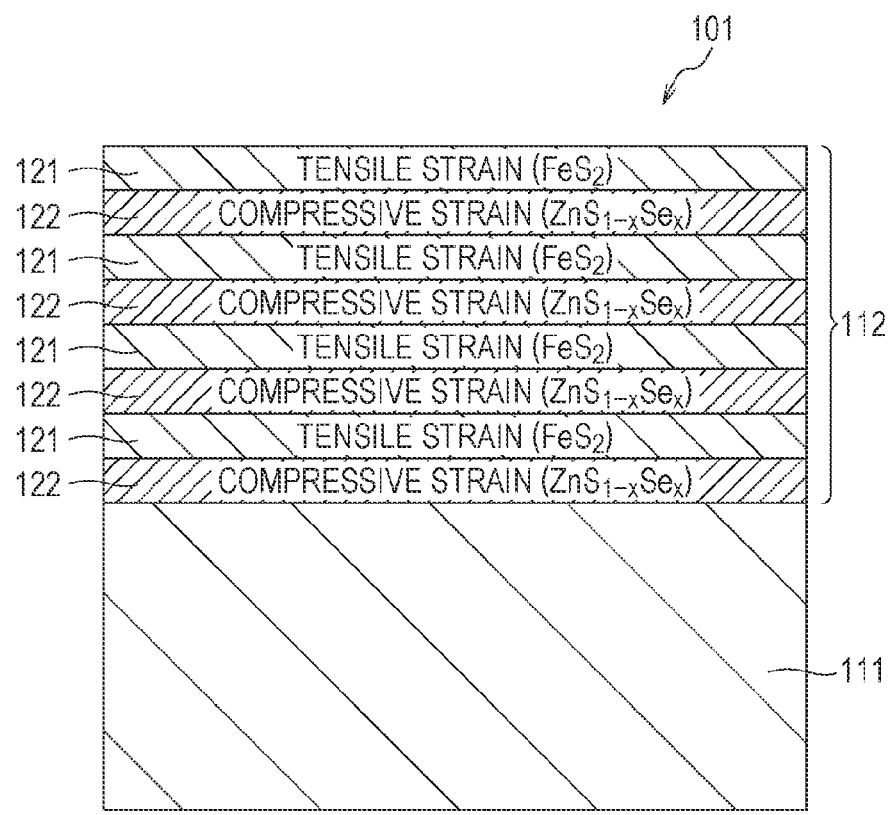
FIG. 9 is a cross sectional diagram which shows another configuration example of the solid-state imaging device to which the present technique is applied.

FIG. 9 is a cross sectional diagram which shows another configuration example of the solid-state imaging device to which the present technique is applied.

In the example in FIG. 9, a photoelectric conversion section 112 with an MQW structure which has a large number of Type II hetero interfaces is formed on the Si substrate 111 in a solid-state imaging device 101.

The photoelectric conversion section 112 is configured so as to remove strain throughout the MQW by setting a compressive strain by increasing the Se composition ratio X of a $ZnS_{1-x}Se_X$ layer 122 to be greater than the lattice matching condition so as to cancel out tensile strain of the $FeS_2$ layer (or the $Fe(S_{1-x}Se_X)_2$ layer) 121.

By doing so, it is possible to suppress the generation of crystal defects even when MQW (the photoelectric conversion section 112) is thickly laminated and as a result, dark current, which is an important characteristic of photoelectric conversion elements or image sensors, is reduced.

Here, the same effects are obtained even when $ZnS_{1-x}Se_X$ or $CuIn_{1-Y}Ga_Y(S_{1-x}Se_X)_2$ is set to tensile strain by controlling the Se composition or the Ga composition, or $GaP_{1-x}N_X$ is set to tensile strain by controlling the N composition so as to cancel out compressive strain of the $Fe(S_{1-x}Se_X)_2$ in the same manner. Here, $0 \leq X$ and $Y \leq 1$.

Above, description was given of the MQW structure of a hetero interface of the $FeS_2$ layer (or the $Fe(S_{1-x}Se_X)_2$ layer) and the ZnS layer (or the $ZnS_{1-x}Se_X$ layer). Without being limited thereto, the same effects are obtained even in the MQW structure of a hetero interface of the $FeS_2$ layer (or the $Fe(S_{1-x}Se_X)_2$ layer) and the $CuInGaS_2$ layer or the $FeS_2$ layer (or the $Fe(S_{1-x}Se_X)_2$ layer) and the GaP layer (or the GaPN layer) in the same manner. Alternatively, as long as combination with the $FeS_2$ layer (or the $Fe(S_{1-x}Se_X)_2$ layer) is possible, the laminating material may be changed half way. For example, an MQW structure with an interface with the ZnS layer (or the $ZnS_{1-x}Se_X$ layer) may be changed halfway to an MQW structure with an interface with the $CuInGaS_2$ layer or the GaP layer (or the $GaP_{1-x}N_X$ layer) and deposited.

In addition, representative examples of the epitaxial growth method for forming the MQW structure described above include molecular beam epitaxy methods (MBE), metal organic chemical vapor deposition methods (MOCVD), liquid phase epitaxy methods (LPE), laser ablation methods, and the like. Basically, any film forming method may be adopted as long as the method is a method for epitaxial growth.

Crystallinity Improvement by Inclined Substrate

Here, when a compound semiconductor material which has a polarity is grown on a nonpolar substrate such as Si, there is a possibility that an anti-fuse domain will be generated. This is a defect where anions and cations are reversed. It is possible to reduce the defects by adopting an Off substrate.

Figure 10:
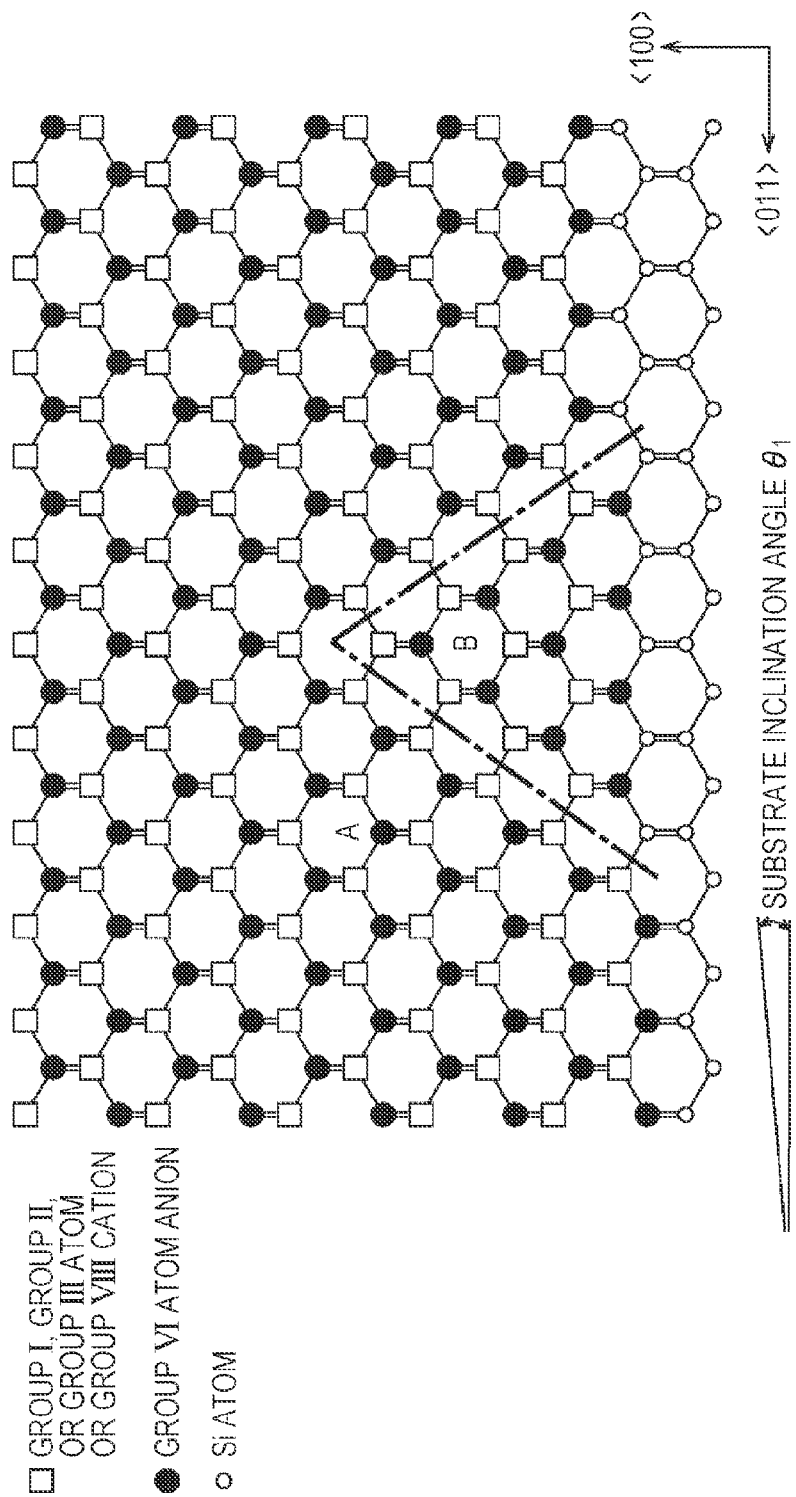
FIG. 10 is a diagram which illustrates an anti-fuse domain.

FIG. 10 is a diagram which illustrates an anti-fuse domain.

For example, the defects which accompany the growth are decreased by using an Si (100) substrate which is off in the <011> direction. As shown in FIG. 10, group VIII cations (atoms with positive ionicity) such as group I, group II, group III, or iron and group VI or group V anions (atoms with negative ionicity) are regularly arranged. However, it is understood that there is an anti-fuse domain (where cations and anions are in a reverse phase) in a part B region thereof.

It is understood that, by closing the B region in a triangle shape along with the crystal growth, only the A region is left and the defects are eliminated. This is due to the substrate being inclined at an angle. Here, for example, the I group atom is a Cu atom, the II group atom is Zn, the III group atom is a Ga or In atom, the VIII group atom is Fe, the VI group atom is an S or Se atom, and the V group atom is a P or N atom, or the like. FIG. 10 is a cross sectional diagram where a crystal is seen in the <011> direction and the squares in the cation rows are lined up in a direction orthogonal to the surface of the paper. In addition, FIG. 10 shows a case where growth starts from the anions; however, the same result of being closed in a triangle shape is obtained even when the growth starts from the cations. Here, the substrate inclination angle $\theta_1$ is approximately 6 deg in these cases. The greater the inclination angle is, the smaller the triangle in the B region is. However, in particular, when the inclination angle is 3 deg or more, even when the B region is the maximum, the B region fits in a size approximately double that in the drawing and a sufficient effect is obtained.

Figure 11:
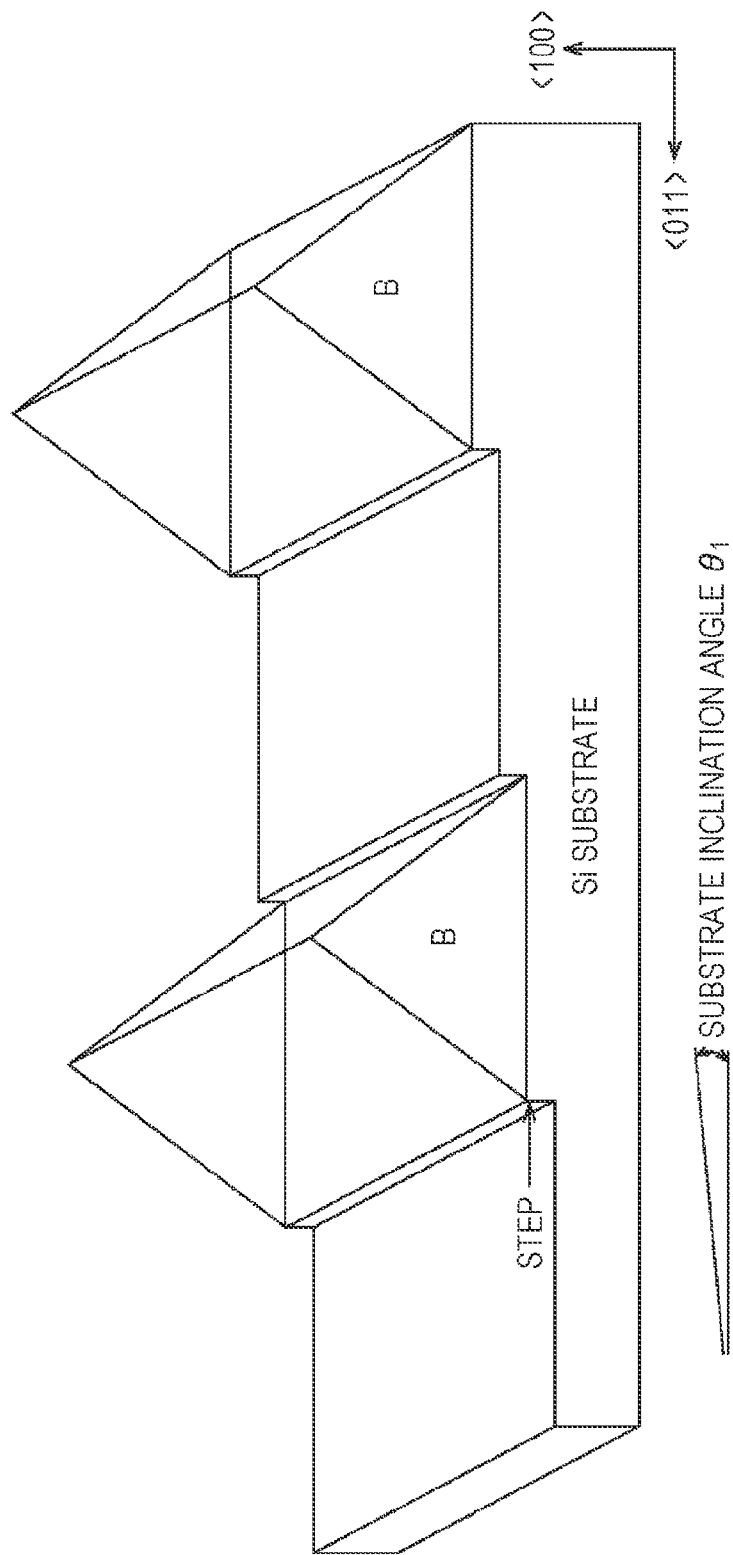
FIG. 11 is a bird's eye diagram of a crystal in FIG. 10.

FIG. 11 is a bird's eye diagram of the crystal in FIG. 10. In the case of the example in FIG. 10, the anti-fuse domain in the B region is closed in a triangle shape along with the growth. However, it is understood that the anti-fuse domain in the B region continues uninterrupted in the depth direction (<0-11> direction) and that the shape is that of a triangular prism put on its side as a result.

Figure 12:
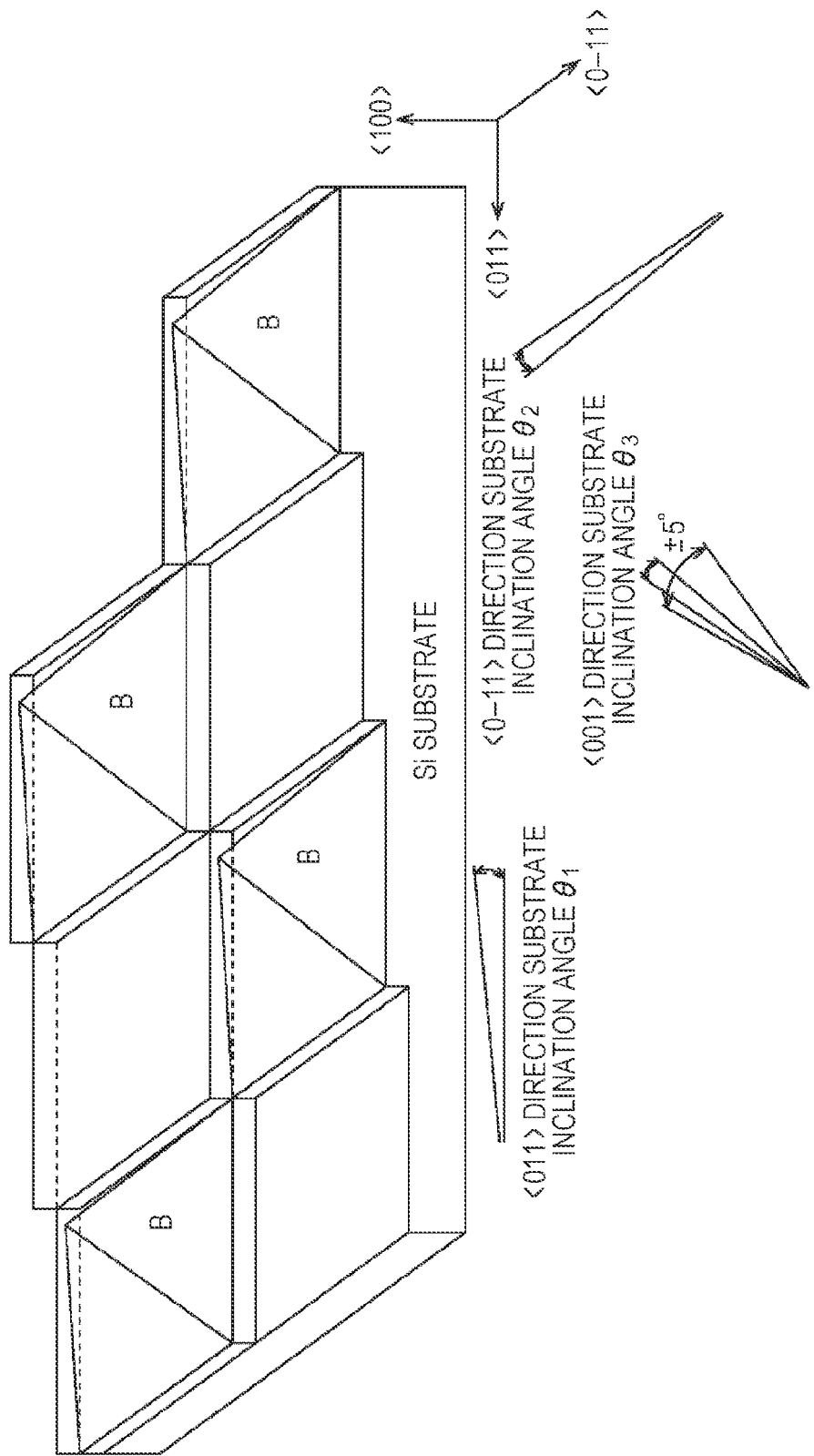
FIG. 12 is a bird's eye diagram of the crystal in FIG. 10.

It is more desirable that reduction of the volume of the anti-fuse domain in the B region be possible by also simultaneously inclining in the <0-11> direction as shown in FIG. 12. Here, since both the <011> direction and the <0-11> direction are equivalent directions for the Si substrate, the same effects are generated either way.

For example, when also inclined with an inclination angle $\theta_2$ in the <0-11> direction, since the effect of being closed in a triangle shape simultaneously occurs from two directions which are orthogonal to each other, a triangular pyramid is created as a result and the volume is reduced. At this time, when inclined at exactly the same angle with both of the inclination angles being 3 deg or more, the inclination is in the <001> direction by the orientation being synthesized, the inclination of the synthesis at that time is 4 deg or more, and the most effective condition is satisfied. At this time, the volume of the anti-fuse domain is reduced to ⅓ in the two directions compared to the inclination in just one direction. However, when the direction is a <001>±5 deg direction including variation, it is possible to say that this is the most effective in terms of production.

From the results above, it is possible to say that it is effective when the inclination angles of <011> and <0-11> are both 3 deg or more. In addition, there is still an effect even in a case where the inclination angles are different. In this case, since the inclination direction is a synthesis of <011> and <0-11>, the inclination angle changes according to the ratio of the two inclination angles. When the orientation is a synthesis of <011> and <0-11> and the inclination angles of the synthesis of both are 3 deg or more, the anti-fuse domain of both is effectively suppressed. In this case, when the ratio of the inclination angle is set to k, the orientation of the inclination is <0(1−k)/2 1>. Here, the ratio k of the inclination angle is defined by the following formula (3) when the inclination in the <011> direction is $\theta_1$ and the inclination in the <0-11> direction is $\theta_2$.

$$k=\mathrm{Tan}(\theta_2)/\mathrm{Tan}(\theta_1) \quad (3)$$

Electron Barrier Layer

Here, when a reverse bias is applied, there is a possibility that electrons will flow from the upper electrode to the photoelectric conversion section and leak out. This is a phenomenon where the electrons exceed the potential by electrolysis due to the difference between the work function of the upper electrode and the electron affinity of the semiconductor material on the photoelectric conversion section surface side being small.

In order to prevent this, a layer which is a potential barrier for electrons may be inserted between the upper electrode and the photoelectric conversion section with the MQW structure.

FIG. 13 is a diagram which shows characteristics of materials which are candidates for the barrier layer materials described above. As shown in FIG. 13, the electron affinity (eV) of NiO is 1.5 and the band gap (eV) is ~4.0. The electron affinity (eV) of $Cu_2O$ is ~3.4 and the band gap (eV) is ~2.1. The electron affinity (eV) of $ZnRh_2O_4$ is ~2.3 and the band gap (eV) is ~2.2.

The electron affinity of NiO, which is one of the candidates for the barrier layer materials, is as small as 1.5 and the band gap thereof is as wide as 4.0 eV. Accordingly, NiO is a sufficient potential barrier (~3.2 eV) with respect to the Fermi level of a transparent electrode (for example, a work function 4.7 eV of ITO).

Configuration Example of Solid-State Imaging Device of the Present Technique

Figure 14:
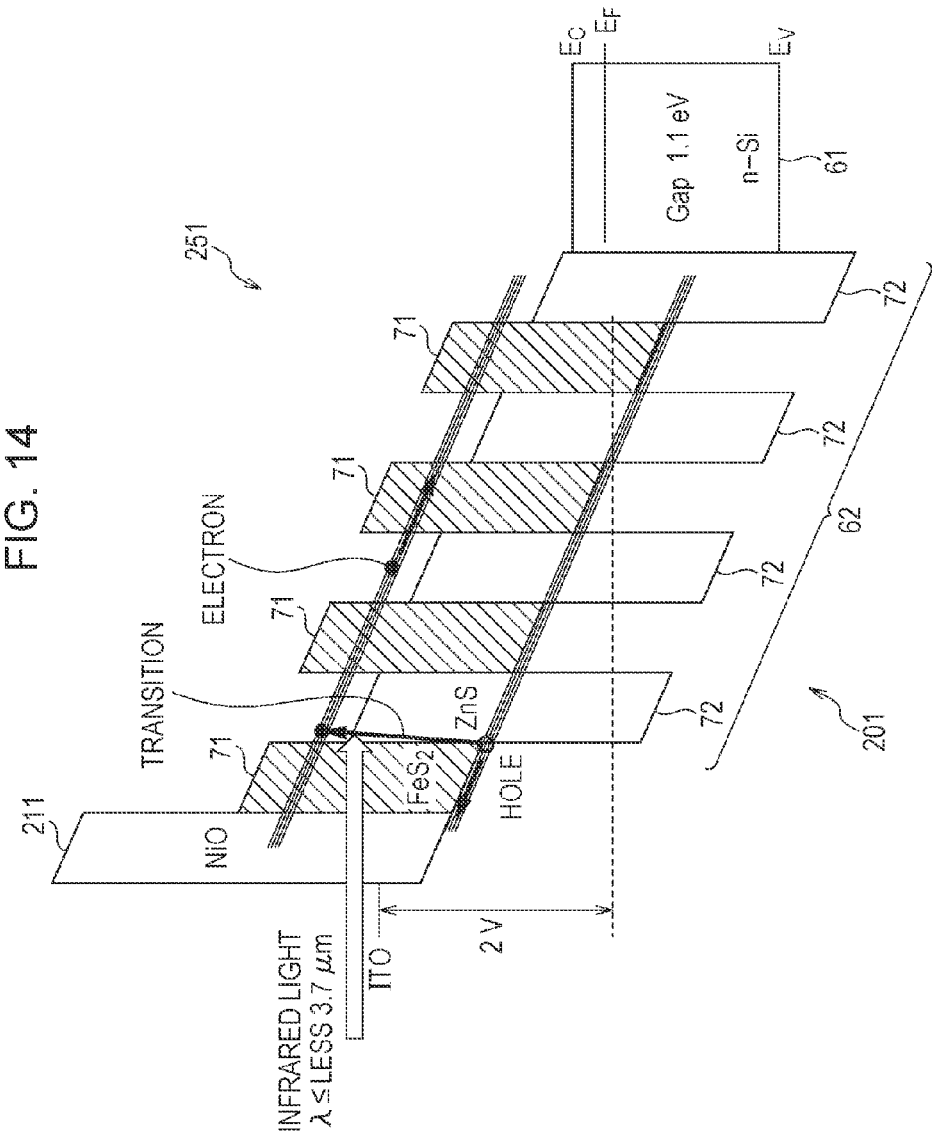
FIG. 14 is a cross sectional diagram which shows a configuration example of the solid-state imaging device where an electron barrier layer is added.

FIG. 14 is a cross sectional diagram which shows a configuration example of the solid-state imaging device to which an electron barrier layer is added.

The point that a solid-state imaging device 201 in FIG. 14 is provided with the Si substrate 61 and the photoelectric conversion section 62 is in common with the solid-state imaging device 51 in FIG. 3. The solid-state imaging device 201 in FIG. 14 is different from the solid-state imaging device 51 in FIG. 3 in the point that an electron barrier layer 211 is added between the upper section electrode (ITO) and the photoelectric conversion section 62.

In the example in FIG. 14, ITO is used for a transparent electrode and NiO is used as the electron barrier layer 211 and a band structure at the time of applying a reverse bias of −2 V is shown. From this result, it is understood that the structure is a structure where the electron barrier layer 211 formed of NiO functions even when a reverse bias is applied. In addition, FIG. 15 shows the results of estimating J-V characteristics from Bethe's emission theory by adding a tunnel effect to the example in FIG. 14.

Figure 15:
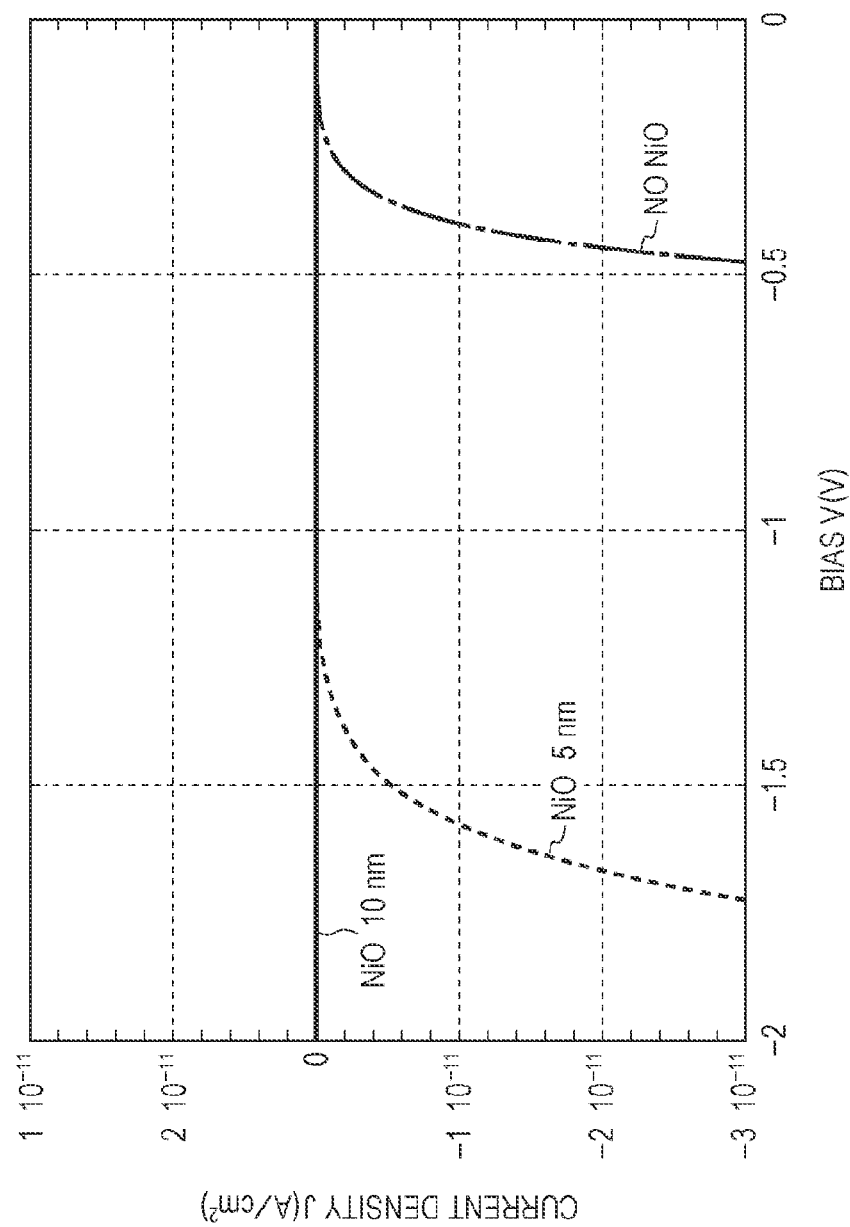
FIG. 15 is a diagram which shows a relationship between bias and current density in cases where an NiO electron barrier layer is present or absent.

In the example in FIG. 15, the graph shows a case without the NiO electron barrier layer 211, a case where the NiO electron barrier layer 211 is 5 nm, and a case where the NiO electron barrier layer 211 is 10 nm. In this graph, the horizontal axis represents a bias V (V) and the vertical axis represents a current density J ($A/cm^2$).

It is understood from this graph that the current density is $J=1\times10-11$ $A/cm^2$ or less by setting the NiO electron barrier layer 211 to 10 nm or more even when the voltage applying condition is −2 V. This value is a sufficient condition for the image sensor since the number of accumulated electrons of dark current is several electrons or less even when being imaged in a normal shutter time of 1/30 second. Here, Li may be doped in the NiO in order to reduce the change of NiO over time.

Figure 16:
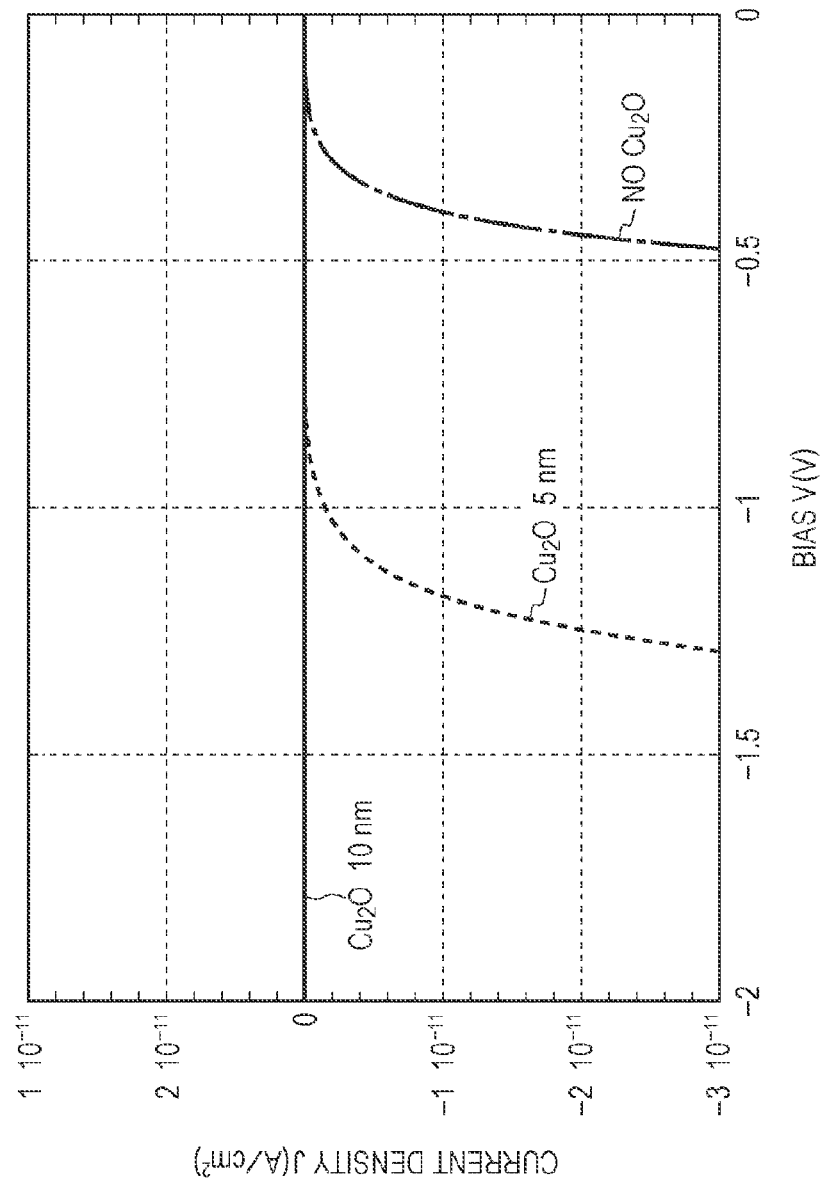
FIG. 16 is a diagram which shows a relationship between bias and current density in cases where a $Cu_2O$ electron barrier layer is present or absent.

Next, description will be given of a case where the material of the electron barrier layer 211 is $Cu_2O$. In this case, the material is a sufficient potential barrier (1.3 eV) with respect to the Fermi level of a transparent electrode (for example, the work function 4.7 eV of ITO). FIG. 16 shows a result which estimates J-V characteristics by using ITO for the transparent electrode, using $Cu_2O$ for the electron barrier layer 211, and adding a tunnel effect at the time of applying a reverse bias.

In the example in FIG. 16, the graph shows a case without the $Cu_2O$ electron barrier layer 211, a case where the $Cu_2O$ electron barrier layer 211 is 5 nm, and a case where the $Cu_2O$ electron barrier layer 211 is 10 nm. In this graph, the horizontal axis represents a bias V (V) and the vertical axis represents a current density J ($A/cm^2$).

It is understood from this graph that the current density is $J=1\times10-11$ $A/cm^2$ or less by setting the $Cu_2O$ electron barrier layer 211 to 10 nm or more even when the voltage applying condition is −2 V. This value is a sufficient condition for the image sensor since the number of accumulated electrons of dark current is several electrons or less even when being imaged in a normal shutter time of 1/30 second.

Here, in the above description, only one type of material is set as the electron barrier layer 211; however, two or more types may be laminated. For example, $Cu_2O$ and $ZnRh_2O_4$ may be laminated to fulfill the role of the barrier layer. In this case, there is an effect even with just $ZnRh_2O_4$; however, since the valence band of $ZnRh_2O_4$ is close to the conduction band of the MQW in energy, there is a concern about current leaking to the MQW. Accordingly, the electron barrier is more effective by further laminating a large number of $Cu_2O$ layers.

Hole Barrier Layer

Holes may flow from the Si substrate to the photoelectric conversion section and leak at the time of applying the reverse bias. This is a phenomenon which occurs due to the difference between the valence band upper end of the Si substrate and the valence band upper end of the semiconductor material on the photoelectric conversion section surface side being small.

In order to prevent this, by growing a ZnS layer (or $ZnS_{1-X}Se_X$ layer), a $CuInGaS_2$ layer or a GaP layer (or a $GaP_{1-X}N_X$ layer) with a thickness of 10 nm or more between the Si substrate and the photoelectric conversion section with the MQW structure, the layer is set as a hole barrier layer. Alternatively, by only growing a ZnS layer (or $ZnS_{1-X}Se_X$ layer), a $CuInGaS_2$ layer, or a GaP layer (or a $GaP_{1-X}N_X$ layer), which is the first layer of the MQW, with a thickness of 10 nm or more, the layer is set as a hole barrier layer.

Configuration Example of Solid-State Imaging Device of the Present Technique

Figure 17:
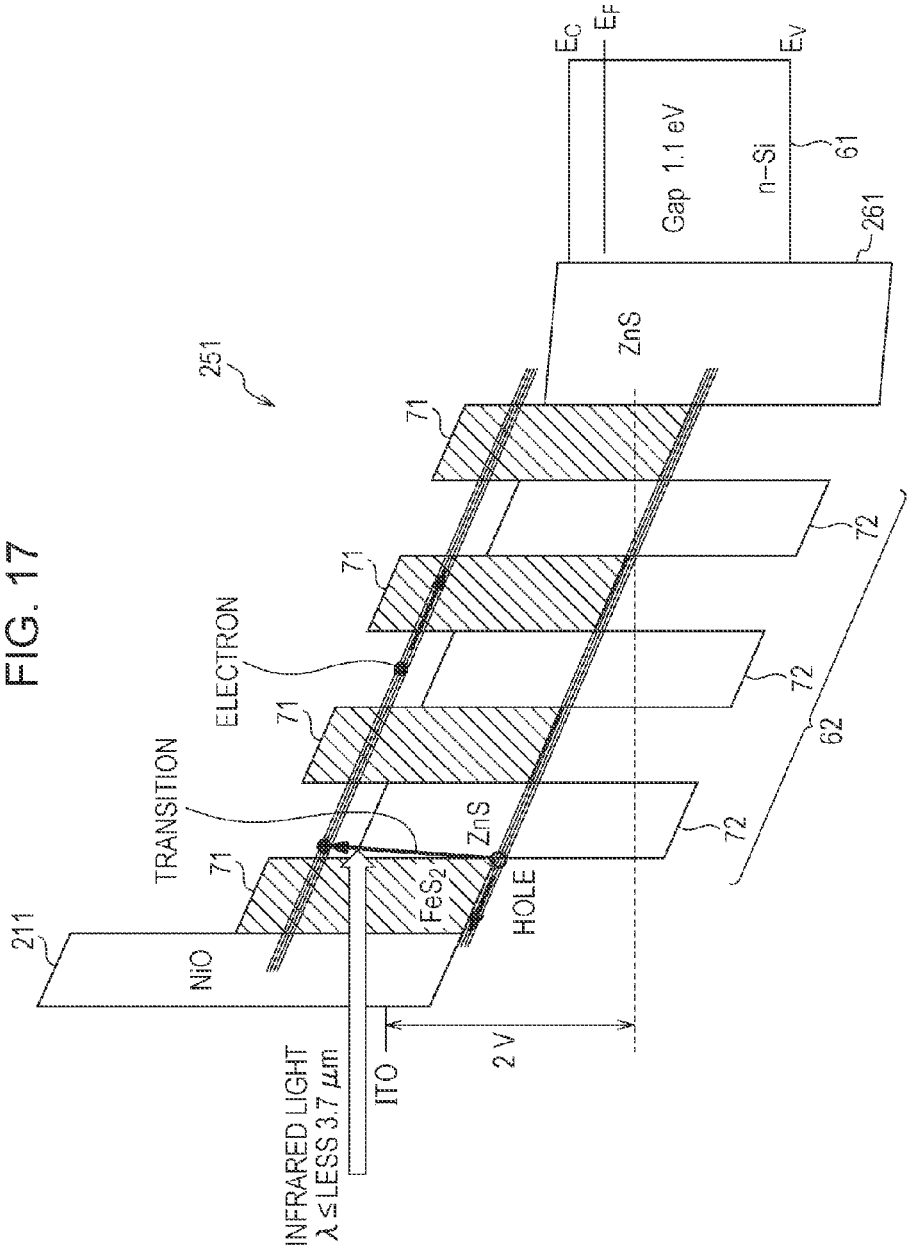
FIG. 17 is a cross sectional diagram which shows a configuration example of the solid-state imaging device to which a hole barrier layer is added.

FIG. 17 is a cross sectional diagram which shows a configuration example of the solid-state imaging device to which a hole barrier layer is added.

The point that a solid-state imaging device 251 in FIG. 17 is provided with the Si substrate 61, the photoelectric conversion section 62, and the electron barrier layer 211 is in common with the solid-state imaging device 201 in FIG. 14. The solid-state imaging device 251 in FIG. 17 is different from the solid-state imaging device 201 in FIG. 14 in the point that a hole barrier layer 261 is added between the Si substrate 61 and the photoelectric conversion section 62.

By configuring the solid-state imaging device in this manner, dark current is further reduced and the characteristics are improved.

As described above, the present technique effectively carries out gap narrowing and an inter-sub-band transition by using a compound semiconductor material which is lattice matched with the Si substrate and forming an MQW structure which has a Type II hetero interface. It is possible for the present technique to be applied to a photoelectric conversion element which has sensitivity from near infrared to midinfrared light or an image sensor.

Since it is also possible for the present technique to be applied to a Si substrate with a large area, mass production is possible and it is possible to provide an inexpensive photoelectric conversion element or image sensor at a low cost.

Configuration Example of Photoelectric Conversion Element

Figure 18:
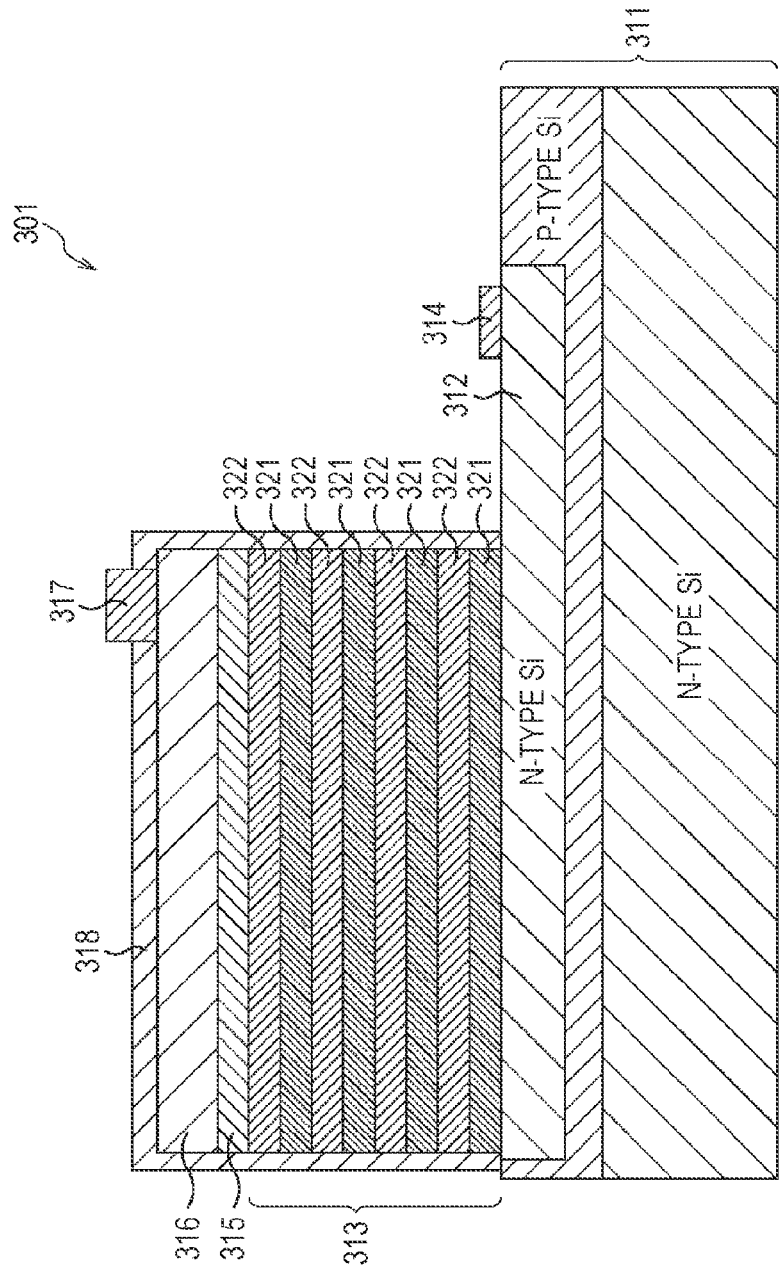
FIG. 18 is a cross sectional diagram which shows a configuration example of a photoelectric conversion element which is included in the solid-state imaging device of the present technique.

FIG. 18 is a cross sectional diagram which shows a configuration example of a photoelectric conversion element which is included in the solid-state imaging device of the present technique.

A photoelectric conversion element 301 is shown in the example in FIG. 18. In the photoelectric conversion element 301, an n-type region 312 is provided in a part of an Si substrate 311 by ion implantation and annealing processing in advance.

A photoelectric conversion section 313 which is a compound semiconductor formed of the MQW structure with the absolute value of a lattice mismatch ratio of less than 1% where a p-type ZnS layer 321 with a thickness of 3 nm and a p-type FeS$_2$ layer 322 with a thickness of 3 nm are alternately laminated is formed with a thickness of 3000 nm on the n-type region 312. In addition, an Al electrode 314 for transmitting electrons from the photoelectric conversion section 313 is formed on the n-type region 312.

Here, the first ZnS layer 321 which is the initial layer on the Si substrate 311 is not typically as thin as 3 nm and it is possible to perform signal reading out even with a thickness of 10 nm or more.

Here, in order to improve the crystallinity, lattice matching with the Si substrate may be carried out by adding Se to FeS$_2$ and ZnS to set Fe(S$_{1-x}$Se$_x$)$_2$ and ZnS$_{1-x}$Se$_x$ as described above with reference to FIG. 6 and FIG. 7. In addition, the strain may be eased using a method which alternately inserts compressive and tensile strain as described above with reference to FIG. 9. The lattice matching condition is X=0.059 in a case of Fe(S$_{1-x}$Se$_x$)$_2$ and X=0.084 in a case of ZnS$_{1-x}$Se$_x$.

In addition, FeS$_2$ (or Fe(S$_{1-x}$Se$_x$)$_2$) exhibits p-type conductivity as a result of being doped with Cu or As. Alternatively, p-type conductivity is exhibited due to S or Se being excessive compared to the stoichiometric ratio even without doping. ZnS (or ZnS$_{1-x}$Se$_x$) is set to be p-type by nitrogen doping. At this time, in particular, the change to p-type is further facilitated by plasma doping.

Reducing dark current which is generated from the surface level with a band structure by further setting the surface side to p+ may be considered.

Figure 19:
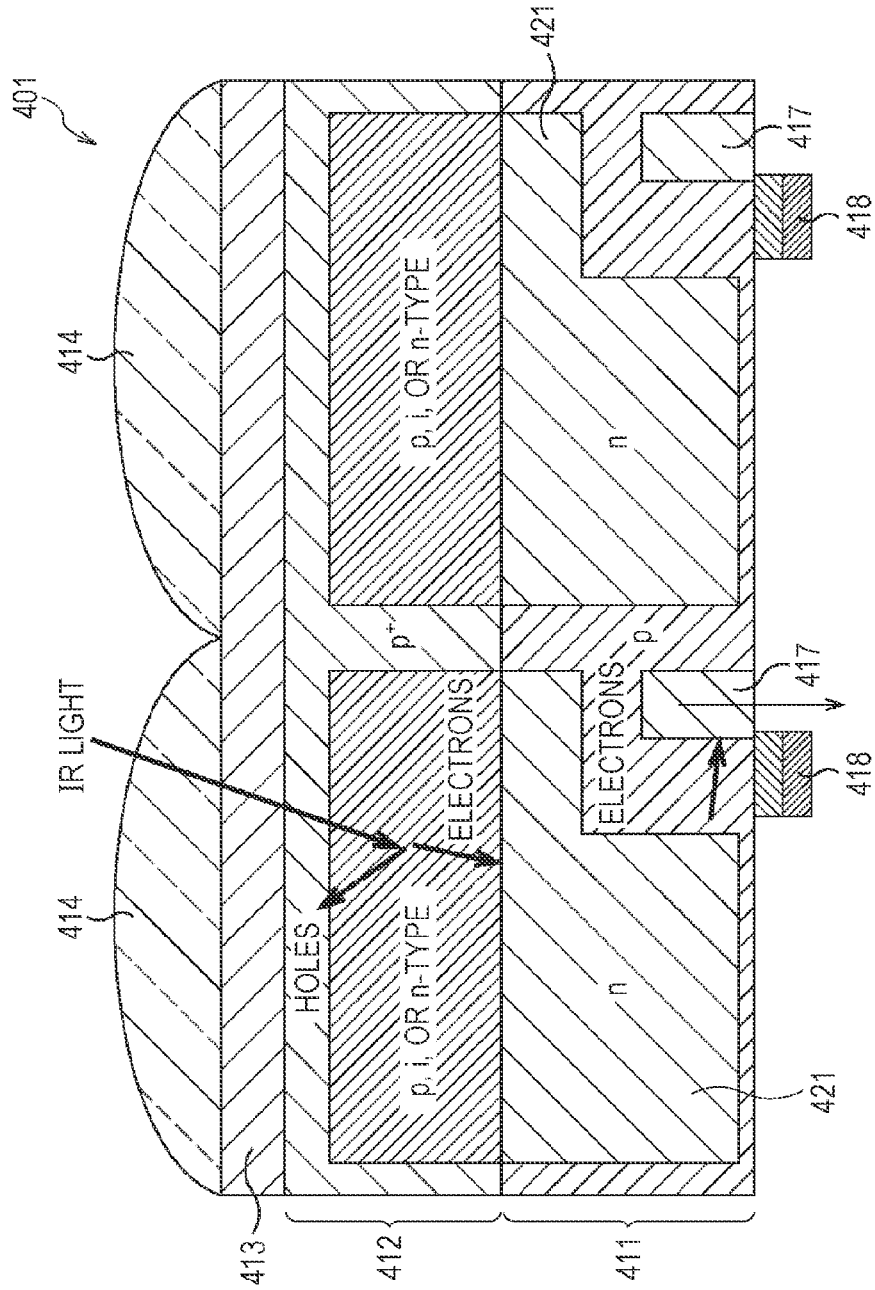
FIG. 19 is a cross sectional diagram which shows a configuration example of the solid-state imaging device in order to illustrate the photoelectric conversion element.

For example, a solid-state imaging device 401 shown in FIG. 19 has a structure with separated pixels due to doping control and a Hole Accumulation Diode (HAD) structure where a hole accumulating p+ layer is added.

In the solid-state imaging device 401, an n-type region 421 is provided in a part of an Si substrate 411. An MQW photoelectric conversion section 412 is formed on the Si substrate 411. Regarding the MQW photoelectric conversion section 412, the p+ region 432 is formed in a part on the n-type region 421 by the doping control for pixel separation after a p-type region 431 is formed. Furthermore, in the MQW photoelectric conversion section 412, the p+ region 432 is formed is formed on the surface side. That is, in the solid-state imaging device 401, since it is possible to store pixels on the p-type region 431 using the p+ region 432, an HAD structure is realized along with the structure with separated pixels being realized and holes are induced, which makes it possible to reduce dark current.

Here, the p-type region 431 is not necessarily p-type and may be i-type or n-type.

For example, a transparent electrode 413 is formed on the MQW photoelectric conversion section 412 and an On Chip Lens (OCL) 414 is formed on the transparent electrode 413.

In addition, a reading out circuit 417 is formed in the p-type region of the Si substrate 411 and a MOS gate 418 is formed in the vicinity of the reading out circuit 417.

In the solid-state imaging device 401 which is configured as above, IR light is incident onto the p-type region 431 via the OCL 414 and the transparent electrode 413 as shown in FIG. 19 and is separated into electrons and holes in the p-type region 431. The holes are discharged on the MQW photoelectric conversion section 412 side of the p+ layer and further to the transparent electrode 413 side and the electrons are read out to the outside by the MOS gate 418 via the reading out circuit 417 from the n-type region 421.

It is possible to suppress dark current by setting the solid-state imaging device to a HAD structure in this manner.

Accordingly, also in the photoelectric conversion element 301 in FIG. 18, it is possible to reduce dark current which is generated from the surface level in a band structure by setting the surface side to p+.

Here, the combination of a large number of layers of the MQW of the photoelectric conversion section 313 in FIG. 18 is a combination of FeS$_2$ (or Fe(S$_{1-x}$Se$_x$)$_2$) and ZnS (or ZnS$_{1-x}$Se$_x$). However, the combination of a large number of layers of the MQW is not limited to this and, for example, may also be a combination of FeS$_2$ or Fe(S$_{1-x}$Se$_x$)$_2$ and CuIn$_{1-y}$Ga$_y$S$_2$ or CuIn$_{1-y}$Ga$_y$(S$_{1-x}$Se$_x$)$_2$ and may also be a combination of FeS$_2$ (or Fe(S$_{1-x}$Se$_x$)$_2$) and GaP (or GaP$_{1-x}$N$_x$). The crystal growth is set to an MBE method; however, the crystal growth is not particularly limited to the MBE method and an MOCVD method, a laser ablation method, or other methods may be used.

Furthermore, an electron barrier layer 315 which has transparency is film-formed with a thickness of 10 nm on the photoelectric conversion section 313 by a vapor deposition method such as a sputtering method. The electron barrier layer 315 is formed, for example, using NiO. Furthermore, an electrode layer 316 which has transparency is formed on top thereof with a thickness of 100 nm by a vapor deposition method such as a sputtering method in the same manner. The electrode layer 316 is formed of, for example, a transparent electrode material such as indium tin oxide (ITO). Since the electron barrier layer 315 is present, it is possible to prevent electrons from moving from the electrode layer 316 to the MQW side of the photoelectric conversion section 313 even at the time of applying a reverse bias and a leak current is suppressed. In addition, the holes which are generated in the MQW of the photoelectric conversion section 313 by light irradiation are able to be discharged to the electrode layer 316 side.

Here, NiO is used as the electron barrier layer 315; however, the same effects are also obtained with $Cu_2O$, $ZnRh_2O_4$, or a multi-layer structure where these are combined. Furthermore, after forming a mask on top thereof using a lithography technique, dry processing is carried out on the photoelectric conversion section 313, the electron barrier layer 315, and the electrode layer 316. Furthermore, after depositing a part of an Al electrode 317 on the electrode layer 316 after removing the mask, a passivation layer 318 formed of $Si_3N_4$ is provided in the periphery as a protective film. It is possible to detect IR light with a long wavelength of ≤~2.5 μm by applying a reverse bias between two electrodes in the photoelectric conversion element 301.

2. Second Embodiment

First Configuration Example of Solid-State Imaging Device

Figure 20:
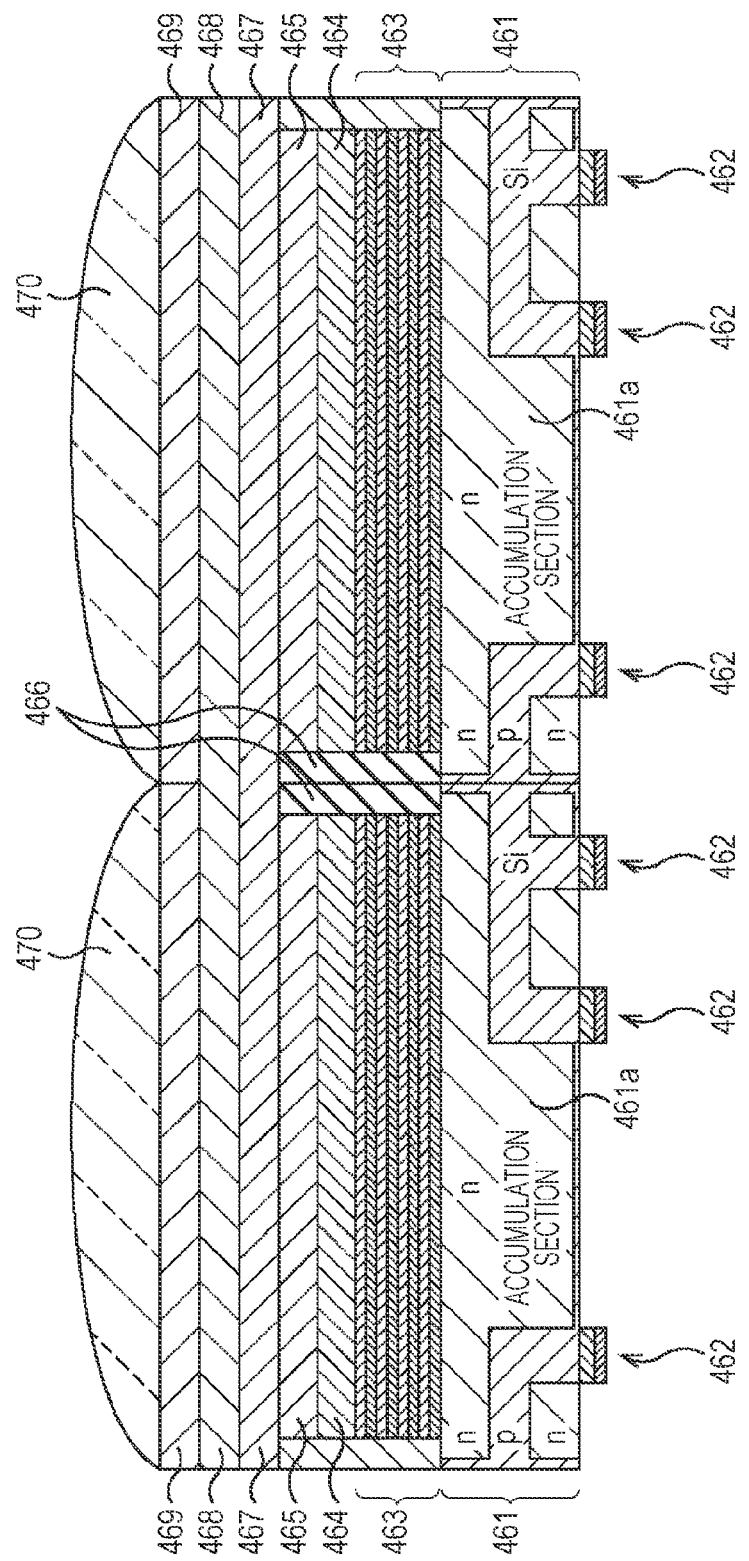
FIG. 20 is a cross sectional diagram which shows a configuration example of the solid-state imaging device to which the present technique is applied.

FIG. 20 is a cross sectional diagram which shows a configuration example of the solid-state imaging device to which the present technique is applied. FIG. 20 shows an example of a case of having a structure with pixels separated by grooves.

In a solid-state imaging device 451, as one of the processes of the pixel separation by a doping control on the side of an Si substrate 461, it is possible to perform p-type and n-type concentration control by carrying out annealing by selectively inserting a dopant by ion implantation or thermal diffusion.

Circuit sections 462 such as a MOS gate, FD, PD, or a reset section are formed by a normal CIS ion implantation process or the like on the circuit side of the n-type Si substrate 461 with a desired structure in advance by performing CIS processing on an electrode, a transistor, or the like. The Si substrate 461 is bonded with a support substrate. A photoelectric conversion section 463 of a compound semiconductor formed of the MQW structure with the absolute value of a lattice mismatch ratio of less than 1% where a p-type $FeS_2$ layer with a thickness of 3 nm and a p-type ZnS layer with a thickness of 3 nm are alternately laminated is formed with a thickness of 3000 nm on an n-type region 461a of the Si substrate 461. Here, the first ZnS layer which is the initial layer on the Si substrate 461 is not typically as thin as 3 nm and may be set to read out signals even with the thickness of 10 nm or more.

Here, lattice matching with the Si substrate 461 may be carried out as $Fe(S_{1-x}Se_x)_2$ and $ZnS_{1-x}Se_x$ by adding Se to $FeS_2$ and ZnS in order to improve crystallinity and as described above with reference to FIG. 9, the strain may be eased using a method which alternately inserts compressive and tensile strain. The lattice matching condition is X=0.059 in a case of $Fe(S_{1-x}Se_x)_2$ and X=0.084 in a case of $ZnS_{1-x}Se_x$.

In addition, here, $FeS_2$ (or $Fe(S_{1-x}Se_x)_2$) exhibits p-type conductivity as a result of being doped with Cu or As. Alternatively, p-type conductivity is exhibited due to S or Se being excessive compared to the stoichiometric ratio even without doping. ZnS (or $ZnS_{1-x}Se_x$) is p-type by nitrogen doping. At this time, in particular, the change to p-type is further facilitated by plasma doping. Here, when one of $FeS_2$ (or $Fe(S_{1-x}Se_x)_2$) and ZnS (or $ZnS_{1-x}Se_x$) is p-type, the whole becomes p-type since the Fermi level is closer to the valence band in the layer and the Fermi level is also accordingly closer to the valence band in the next layer at the same time. Therefore, it is sufficient if only one of these is p-type. Furthermore, as described above with reference to FIG. 19, reducing the dark current which is generated from the surface level with a band structure by setting the surface side to p+ may be considered.

Here, for the combination of the multiple layers of the MQW in the photoelectric conversion section 463, a combination of $FeS_2$ or $Fe(S_{1-x}Se_x)_2$ and ZnS or $ZnS_{1-x}Se_x$ is described; however, the combination may also be a combination of $FeS_2$ or $Fe(S_{1-x}Se_x)_2$ and $CuIn_{1-y}Ga_yS_2$ or $CuIn_{1-y}Ga_y(S_{1-x}Se_x)_2$ or may also be a combination of $FeS_2$ or $Fe(S_{1-x}Se_x)_2$ and GaP or $GaP_{1-x}N_x$. The crystal growth is set to an MBE method; however, the crystal growth is not particularly limited to the MBE method and an MOCVD method, a laser ablation method, or other methods may be used.

In the solid-state imaging device 451, after the photoelectric conversion section 463 is formed, an NiO layer 464 which is an electron barrier layer is film-formed on the photoelectric conversion section 463 by sputtering vapor deposition. Here, film forming of the NiO layer 464 is possible even using vacuum vapor deposition with an electronic gun or laser ablation. In addition, film forming the electron barrier layer is also possible with $Cu_2O$ or $ZnRh_2O_4$ instead of NiO, using the same methods.

Furthermore, an ITO 465, the NiO layer 464, and the photoelectric conversion section 463 are partially removed by RIE processing by selectively attaching a resist to each pixel using a lithography technique after sputtering vapor deposition is carried out using ITO 465 which is a transparent electrode. Furthermore, after removing the resist, an $SiO_2$ layer 466 is film-formed by the CVD method to fill in the grooves. Furthermore, after the $SiO_2$ layer 466 which is the uppermost surface is removed by Chemical Mechanical Polishing (CMP) and sputtering vapor deposition is carried out using an ITO 467, $Si_3N_4$ is film-formed thereon as a passivation film 468 by CVD.

Here, $Si_3N_4$ is used as the passivation film 468; however, $(Si_3N_4)_x(SiO_2)_{1-x}$ or $SiO_2$ also have similar effects. Furthermore, after polymer materials are coated by spin coating in order to flatten the surface and a polymer layer 469 is formed, an OCL 470 is formed on each of the pixels by a normal OCL process. Here, the ITO 467 of the upper section is a common electrode. Due to this, the image sensor is able to detect IR light with a long wavelength of ≤~2.5 μm.

3. Third Embodiment

Second Configuration Example of Solid-State Imaging Device

Figure 21:
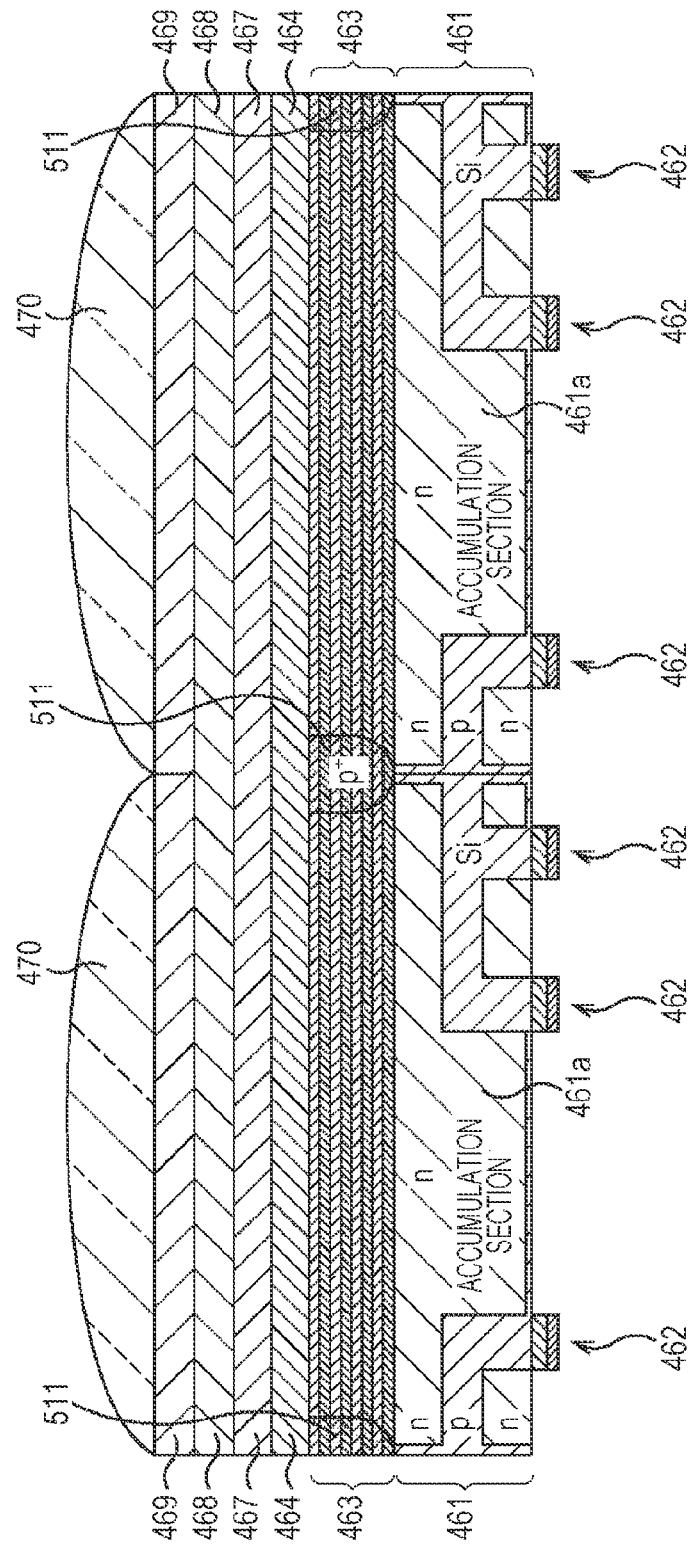
FIG. 21 is a cross sectional diagram which shows a configuration example of the solid-state imaging device to which the present technique is applied.

FIG. 21 is a cross sectional diagram which shows a configuration example of the solid-state imaging device to which the present technique is applied. FIG. 21 shows an example of a case of having a p+ structure with separated pixels.

The point that an solid-state imaging device 501 in FIG. 21 is provided with the Si substrate 461, the n-type region 461a, the circuit section 462, the photoelectric conversion section 463, the NiO layer 464, the ITO 467, the passivation film 468, the polymer layer 469, and the OCL 470 is in common with the solid-state imaging device 451 in FIG. 20.

The solid-state imaging device 501 in FIG. 21 is different from the solid-state imaging device 451 in FIG. 20 in the point that the pixel separation in the $SiO_2$ layer 466 changed to the pixel separation in a p+ layer 511 and in the point that the ITO 465 is removed.

That is, after the photoelectric conversion section 463 is formed in the solid-state imaging device 501, a mask of a resist is selectively attached to each pixel using a lithography technique and As+ or Cu+, which are dopants, is ion-implanted. Furthermore, the p+ layer 511 is formed by performing a heating process at 400° C. or more and activating the dopant. Alternatively, the p+ layer 511 with an increased p concentration is formed as a result of increasing the p concentration.

Here, mainly, the $FeS_2$ or $Fe(S_{1-X}Se_X)_2$ layer of the photoelectric conversion section (MQW) 463 is the p+ layer 511 and the entire photoelectric conversion section (MQW) 463 is p+ even when the p concentration of ZnS (or $ZnS_{1-X}Se_X$) does not change. Furthermore, on top thereof, the NiO layer 464 which is an electron barrier layer is film-formed on the photoelectric conversion section (MQW) 463 by sputtering vapor deposition. Here, film forming of NiO is possible even with vacuum vapor deposition using an electronic gun or laser ablation. In addition, film forming is also possible with $Cu_2O$ or $ZnRh_2O_4$ instead of NiO, using the same methods.

Furthermore, after sputtering vapor deposition is carried out using the ITO 467, $Si_3N_4$ is film-formed thereon as the passivation film 468 by CVD. Here, $Si_3N_4$ is used; however, $(Si_3N_4)_X(SiO_2)_{1-X}$ or $SiO_2$ also have similar effects. Furthermore, after polymer materials are coated by spin coating in order to flatten the surface and the polymer layer 469 is formed, the OCL 470 is formed on each of the pixels by the normal OCL process. Here, the ITO 467 is a common electrode. Due to this, the image sensor is able to detect IR light with a long wavelength of at least ≤~2.5 μm.

4. Fourth Embodiment

Third Configuration Example of Solid-State Imaging Device

Figure 22:
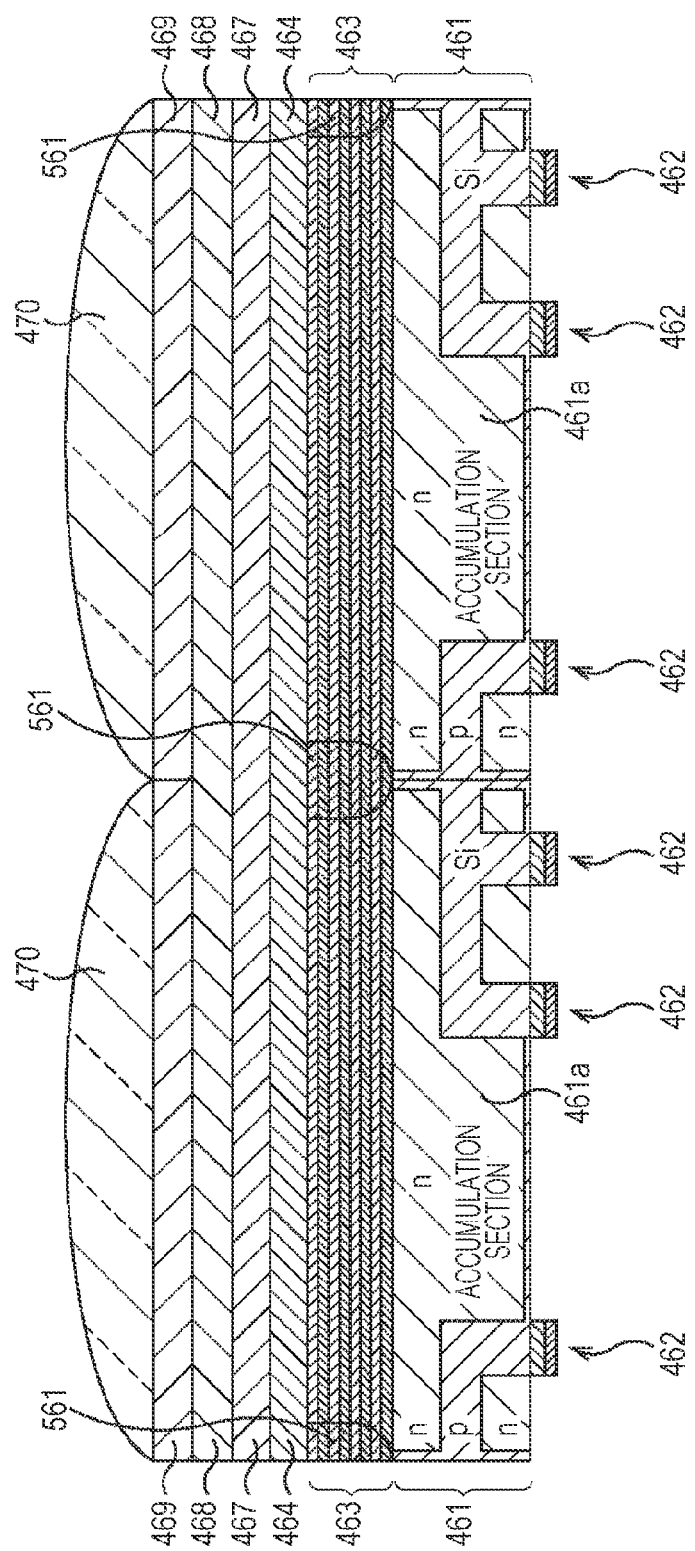
FIG. 22 is a cross sectional diagram which shows a configuration example of the solid-state imaging device to which the present technique is applied.

FIG. 22 is a cross sectional diagram which shows a configuration example of the solid-state imaging device to which the present technique is applied. FIG. 22 shows an example of a case of having a structure with separated pixels by increasing the resistance using ion implantation.

The point that a solid-state imaging device 551 in FIG. 22 is provided with the Si substrate 461, the n-type region 461a, the circuit section 462, the photoelectric conversion section 463, the NiO layer 464, the ITO 467, the passivation film 468, the polymer layer 469, and the OCL 470 is in common with the solid-state imaging device 451 in FIG. 20.

The solid-state imaging device 551 in FIG. 22 is different from the solid-state imaging device 451 in FIG. 20 in the point that the pixel separation in the $SiO_2$ layer 466 changed to the pixel separation in the high resistance region 561 and in the point that the ITO 465 is removed.

That is, in the solid-state imaging device 551, after the photoelectric conversion section 463 is formed, a mask of a resist is selectively attached to each pixel using a lithography technique and B+ or H+ where the electrical resistance of the photoelectric conversion section (MQW) 463 is increased by ion implantation is ion-implanted. Here, as long as the resistance is increased, any type of ions may be used. At this time, since the resistance is increased between pixels in the photoelectric conversion section (MQW) 463 and a high resistance region 561 results, pixel separation is possible as a result since the photovoltaic current only flows in the vicinity of the center of the pixels.

Furthermore, on top thereof, the NiO layer 464 which is an electron barrier layer is film-formed on the photoelectric conversion section (MQW) 463 by sputtering vapor deposition. Here, film forming of NiO is possible even with vacuum vapor deposition using an electronic gun or laser ablation. In addition, film forming is also possible with $Cu_2O$ or $ZnRh_2O_4$ instead of NiO, using the same methods.

Furthermore, after sputtering vapor deposition is carried out using the ITO 467, $Si_3N_4$ is film-formed thereon as the passivation film 468 by CVD. Here, $Si_3N_4$ is used; however, $(Si_3N_4)_X(SiO_2)_{1-X}$ or $SiO_2$ also have similar effects. Furthermore, after polymer materials are coated by spin coating in order to flatten the surface and the polymer layer 469 is formed, the OCL 470 is formed on each of the pixels by the normal OCL process. Here, the ITO 467 is a common electrode. Due to this, it becomes an image sensor which is able to detect IR light with a long wavelength of at least ≤~2.5 μm.

5. Fifth Embodiment

Fourth Configuration Example of Solid-State Imaging Device

Figure 23:
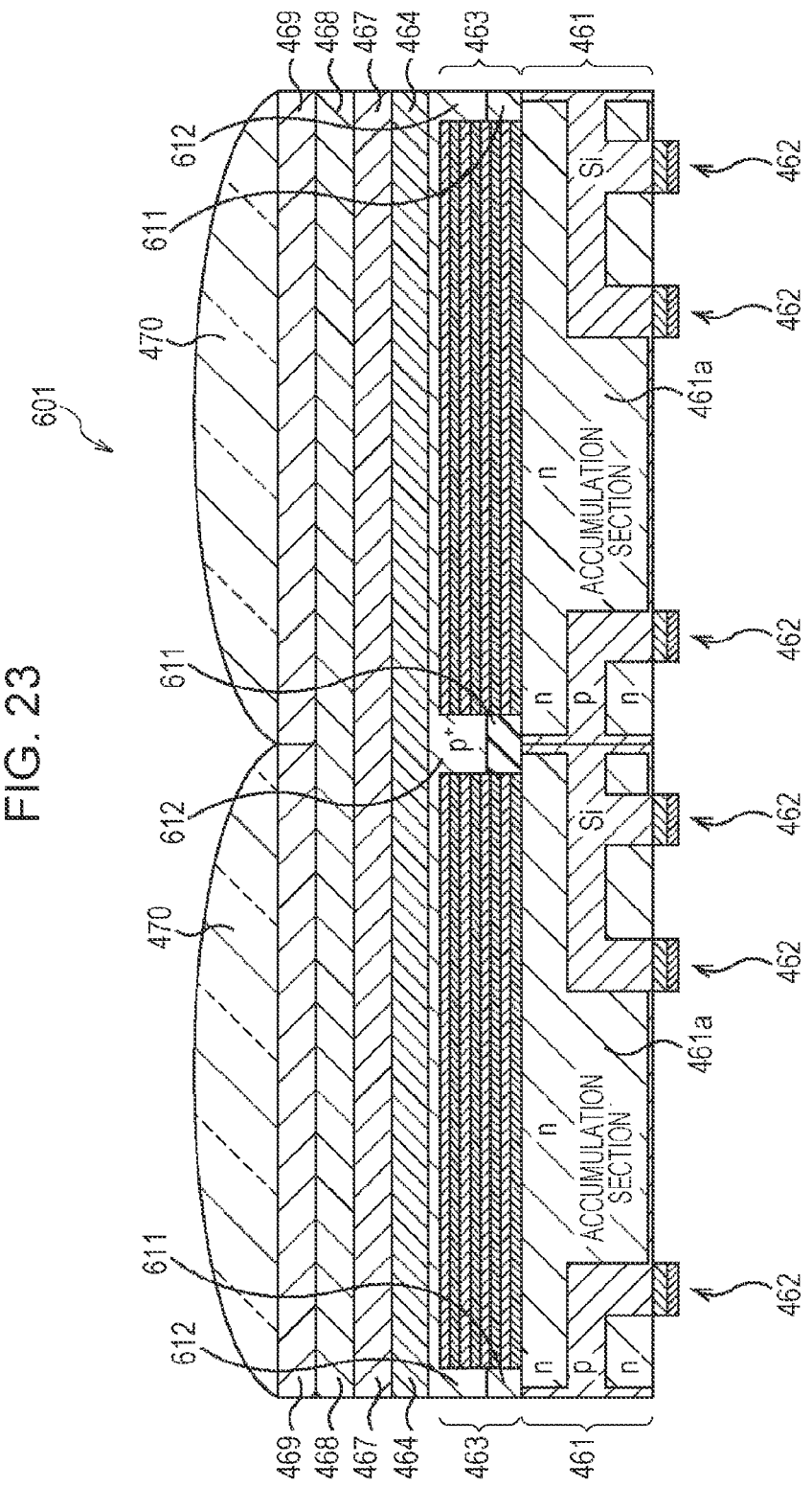
FIG. 23 is a cross sectional diagram which shows a configuration example of the solid-state imaging device to which the present technique is applied.

FIG. 23 is a cross sectional diagram which shows a configuration example of the solid-state imaging device to which the present technique is applied. FIG. 23 shows an example of a case of having a p+ structure with separated pixels by selection growth control.

A solid-state imaging device 601 in FIG. 23 is different from the solid-state imaging device 451 in FIG. 20 in the point of being changed to the pixel separation in the Si substrate 461, the n-type region 461a, the circuit section 462, the photoelectric conversion section 463, the NiO layer 464, the ITO 467, the passivation film 468, an inorganic material film 611, and the p+ region 612 and in the point that the ITO 465 is removed.

That is, in the solid-state imaging device 601, after bonding the Si substrate 461 with the support substrate, the inorganic material film 611 which partially masks the selection growth of $SiO_2$ or the like is further formed on and between pixels using a lithography technique and a dry etching technique. After that, in the same manner as the solid-state imaging device 451 in FIG. 20, the photoelectric conversion section 463 of a compound semiconductor formed of the MQW structure with the absolute value of a lattice mismatch ratio of less than 1% where a p-type $FeS_2$ layer with a thickness of 3 nm and a p-type ZnS layer with a thickness of 3 nm are alternately laminated is formed with a thickness of 3000 nm on the n-type region 461a of the Si substrate 461. Here, the first ZnS which is the initial layer on the Si substrate 461 is not typically as thin as 3 nm and may be set to read out signals even with the thickness of 10 nm or more.

Here, lattice matching with the Si substrate 461 may be carried out as $Fe(S_{1-X}Se_X)_2$ and $ZnS_{1-X}Se_X$ by adding Se to $FeS_2$ and ZnS in order to improve crystallinity and, as described above with reference to FIG. 9, the strain may be eased using a method which alternately inserts compressive and tensile strain. The lattice matching condition is X=0.059 in a case of $Fe(S_{1-X}Se_X)_2$ and X=0.084 in a case of $ZnS_{1-X}Se_X$.

In addition, here, $FeS_2$ (or $Fe(S_{1-X}Se_X)_2$) exhibits p-type conductivity as a result of being doped with Cu or As. Alternatively, p-type conductivity is exhibited due to S or Se being excessive compared to the stoichiometric ratio even without doping. ZnS (or $ZnS_{1-X}Se_X$) is set to be p-type by nitrogen doping. At this time, in particular, the change to p-type is further facilitated by plasma doping. Here, when one of $FeS_2$ (or $Fe(S_{1-X}Se_X)_2$) and ZnS (or $ZnS_{1-X}Se_X$) is p-type, since the whole accordingly becomes p-type, it is sufficient if only one of these is p-type.

Furthermore, by carrying out growth by including lateral growth, increasing dopants between pixels and on the surface of the photoelectric conversion section 463 to set the photoelectric conversion section 463 to be p+, it is possible to reduce pixel separation and a current which is generated with a band structure from the surface level at the same time.

It is possible to control the selection growth or the lateral growth by changing the growth conditions. For example, in MDCVD, the growth becomes the selection growth when the pressure is decreased, and the growth is lateral growth when the pressure is increased.

Here, for the combination of multiple layers of the MQW in the photoelectric conversion section 463, a combination of $FeS_2$ or $Fe(S_{1-x}Se_x)_2$ and ZnS or $ZnS_{1-x}Se_x$ is described; however, the combination may also be a combination of $FeS_2$ or $Fe(S_{1-x}Se_x)_2$ and $CuIn_{1-y}Ga_yS_2$ or $CuIn_{1-y}Ga_y(S_{1-x}Se_x)_2$ and may also be a combination of $FeS_2$ or $Fe(S_{1-x}Se_x)_2$ and GaP or $GaP_{1-x}N_x$. The crystal growth is set to an MBE method; however, the crystal growth is not particularly limited to the MBE method and an MOCVD method, a laser ablation method, or other methods may be used.

In the solid-state imaging device 601, after the photoelectric conversion section 463 is formed, the NiO layer 464 which is an electron barrier layer is formed on the photoelectric conversion section 463 by sputtering vapor deposition as the next step. Here, film forming of the NiO layer 464 is possible even with vacuum vapor deposition using an electronic gun or laser ablation. In addition, film forming the electron barrier layer is also possible with $Cu_2O$ or $ZnRh_2O_4$ instead of NiO, using the same methods.

Furthermore, after sputtering vapor deposition is carried out using the ITO 467, $Si_3N_4$ is film-formed thereon as the passivation film 468 by CVD. Here, $Si_3N_4$ is used; however, $(Si_3N_4)_x(SiO_2)_{1-x}$ or $SiO_2$ also have similar effects. Furthermore, after polymer materials are coated by spin coating in order to flatten the surface and the polymer layer 469 is formed, the OCL 470 is formed on each of the pixels by the normal OCL process. Here, the ITO 467 is a common electrode. Due to this, the image sensor is able to detect IR light with a long wavelength of at least ≤~2.5 μm.

Here, in the above description, description is given that it is possible to detect IR light with a long wavelength of ≤~2.5 μm; however, it is also possible to detect visible light according to the present technique.

In addition, in the above description, an example of a back surface illumination type solid-state imaging device is described; however, the present technique is also able to be applied to a front surface illumination type solid-state imaging device.

In the above, description is given of a configuration where the present technique is applied to the CMOS solid-state imaging device; however, the present technique may be applied to a solid-state imaging device such as the Charge Coupled Device (CCD) solid-state imaging device. In addition, the present technique is also able to be applied to a laminate type solid-state imaging device.

In addition, description was given of a configuration where the present technique is applied to a photoelectric conversion element; however, the present technique is able to be applied to any light detecting device such as surveillance cameras or vehicle cameras which are able to be used at night, detectors for preventing collisions which are also vehicle-mounted, medical or agricultural applications which are able to detect amounts of moisture as long as the device detects light in the same manner as a photoelectric conversion element.

Here, the present technique is not limited to application to a solid-state imaging device and is also able to be applied to an imaging device. Here, the imaging device refers to an electronic apparatus which has an imaging function such as a camera system such as a digital still camera or a digital video camera, a cell phone, or the like. Here, there are also cases where a modular form which is mounted on an electronic apparatus, that is, a camera module, is set as an imaging device.

6. Sixth Embodiment

Configuration Example of Electronic Apparatus

Here, description will be given of a configuration example of an electronic apparatus where the present technique is applied with reference to FIG. 24.

Figure 24:
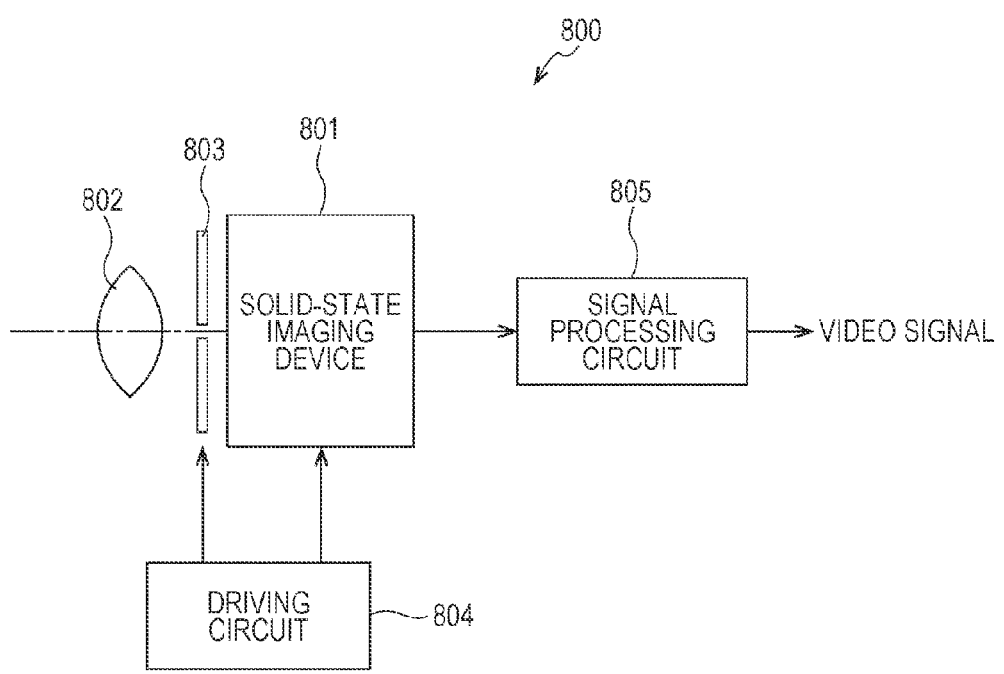
FIG. 24 is a block diagram which shows a configuration example of an electronic apparatus to which the present technique is applied.

An electronic apparatus 800 shown in FIG. 24 is provided with a solid-state imaging device (element chip) 801, an optical lens 802, a shutter device 803, a driving circuit 804, and a signal processing circuit 305. Any of the solid-state imaging devices out of the first to fifth embodiments in the present technique described above is provided as the solid-state imaging device 801. Due to this, mass production of a photoelectric conversion element or the like is possible and as a result, it is possible to provide an inexpensive electronic apparatus at a low cost.

The optical lens 802 focuses image light (incident light) from a subject onto the imaging surface of the solid-state imaging device 801. Due to this, signal charges are accumulated for a certain period in the solid-state imaging device 801. The shutter device 803 controls a light irradiation period and a light shielding period with respect to the solid-state imaging device 801.

The driving circuit 804 supplies a driving signal which controls the signal transfer operation of the solid-state imaging device 801 and the shutter operation of the shutter device 803. The solid-state imaging device 801 performs the signal transfer according to the driving signal (timing signal) which is supplied from the driving circuit 804. A signal processing circuit 805 performs various types of signal processing with respect to the signal which is output from the solid-state imaging device 801. The video signal on which the signal processing is performed is stored in a storage medium such as a memory or is output to a monitor.

Here, in the present specification, the steps which describe a series of processes described above naturally include processes which are performed in time series in the described order and also include processes which are executed simultaneously or individually, without typically being processed in time series.

In addition, the embodiments in the present disclosure are not limited to the embodiments described above and various types of changes are possible within a range which does not depart from the gist of the present disclosure.

In addition, in the above, the embodiments may be configured as a plurality of devices (or processing sections) by dividing the configuration which was described as one device (or processing section). In contrast to this, the embodiment may be configured as one device (or processing section) by assembling the configuration which was described as a plurality of devices (or processing sections) above. In addition, naturally, other configurations than the configurations described above may be added to the configuration of each device (or each processing section). Furthermore, as long as the configuration or the operation of the system as a whole is substantially the same, a part of a configuration of a certain device (or processing section) may be included in the configuration of another device (or another processing section). In other words, the present technique is not limited to the embodiments described above and various types of changes are possible within a range which does not depart from the gist of the present technique.

Above, detailed description is given of the favorable embodiments of the present disclosure with reference to the attached diagrams; however, the present disclosure is not limited to the examples. It is clear that it is possible to conceive of various types of modified examples or corrected examples within the category of the technical idea described in the scope of the claims with normal knowledge in the technical field to which the present disclosure belongs, and these are also naturally understood to belong to the technical range of the present disclosure.

Here, the present technique is able to have the following configurations.

(1) A solid-state imaging device which has a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light.

(2) The solid-state imaging device according to (1) in which the MQW structure has a Type II hetero interface and a thickness of each layer is set so as to form an inter-sub-band transition.

(3) The solid-state imaging device according to (2), in which the hetero interface is formed of $FeS_2$ or $Fe(S_{1-X1}Se_{X1})_2$, ZnS or $ZnS_{1-X2}Se_{X2}$, $CuIn_{1-Y1}Ga_{Y1}S_2$ or $CuIn_{1-Y2}Ga_{Y2}(S_{1-X3}Se_{X3})_2$, or GaP or $GaP_{1-X4}N_{X4}$.

(4) The solid-state imaging device according to (3) in which the hetero interface applies compressive strain to $ZnS_{1-X2}Se_{X2}$ or $CuIn_{1-Y2}Ga_{Y2}(S_{1-X3}Se_{X3})_2$ by controlling a Se composition or applies compressive strain to $GaP_{1-X4}N_{X4}$ by controlling the N composition so as to cancel out tensile strain of $FeS_2$ or $Fe(S_{1-X1}Se_{X1})_2$.

(5) The solid-state imaging device according to (3), in which the hetero interface applies tensile strain to $ZnS_{1-X2}Se_{X2}$ or $CuIn_{1-Y2}Ga_{Y2}(S_{1-X3}Se_{X3})_2$ by controlling a Se composition or a Ga composition or applies tensile strain to $GaP_{1-X4}N_{X4}$ by controlling the N composition so as to cancel out the compressive strain of $Fe(S_{1-X1}Se_{X1})_2$.

(6) The solid-state imaging device according to any one of (1) to (5), including an electron barrier layer which is provided on the surface side of the MQW structure, and an electrode which is arranged on the electron barrier layer.

(7) The solid-state imaging device according to (6) in which the electron barrier layer is formed using NiO, $Cu_2O$, or $ZnRh_2O_4$.

(8) The solid-state imaging device according to (6), in which the thickness of the electron barrier layer is 10 nm or more.

(9) The solid-state imaging device according to any one of (1) to (8), in which a hole barrier layer is formed between the silicon substrate and the MQW structure or a hole barrier layer is set by increasing the thickness of the first layer only on the silicon substrate side of the MQW structure.

(10) The solid-state imaging device according to (9), in which the hole barrier layer includes any one of ZnS or $ZnS_{1-X2}Se_{X2}$, $CuIn_{1-Y1}Ga_{Y1}S_2$ or $CuIn_{1-Y2}Ga_{Y2}(S_{1-X3}Se_{X3})_2$, or GaP or $GaP_{1-X4}N_{X4}$, and the thickness thereof is 10 nm or more.

(11) The solid-state imaging device according to any one of (1) to (10), in which an inclined substrate is used as the silicon substrate.

(12) The solid-state imaging device according to (11), in which the inclined substrate is a substrate which is inclined in the <011> direction or a synthesis direction of <011> and <0-11>.

(13) The solid-state imaging device according to any one of (1) to (12) which has a structure with separated pixels.

(14) The solid-state imaging device according to (13), in which the structure with separated pixels is created by forming a groove by etching a part between pixels of the photoelectric conversion section.

(15) The solid-state imaging device according to (13), in which the structure with separated pixels is created by setting a part between the pixels of the photoelectric conversion section to p+.

(16) The solid-state imaging device according to (13), in which the structure with separated pixels is created by increasing the resistance of a part between the pixels of the photoelectric conversion section using ion implantation.

(17) The solid-state imaging device according to any one of (1) to (16), in which the surface layer of the photoelectric conversion part is p+.

(18) A light detecting device which has a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light.

(19) The light detecting device according to (18) in which the MQW structure has a Type II hetero interface and a thickness of each layer is set so as to form an inter-sub-band transition.

(20) An electronic apparatus including a solid-state imaging device provided with a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light, an optical system which emit incident light to the solid-state imaging device, and a signal processing circuit which processes an output signal which is output from the solid-state imaging device.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light, wherein the MQW structure has a photoelectron conversion part, and wherein a surface layer of the photoelectron conversion part is p+.

2. The solid-state imaging device according to claim 1, wherein the MQW structure has a Type II hetero interface and a thickness of each layer is set so as to form an inter-sub-band transition.

3. The solid-state imaging device according to claim 2, wherein the hetero interface is formed of $FeS_2$ or $Fe(S_{1-X1}Se_{X1})_2$, ZnS or $ZnS_{1-X2}Se_{X2}$, $CuIn_{1-Y1}Ga_{Y1}S_2$ or $CuIn_{1-Y2}Ga_{Y2}(S_{1-X3}Se_{X3})_2$, or GaP or $GaP_{1-X4}N_{X4}$.

4. The solid-state imaging device according to claim 3, wherein the hetero interface applies compressive strain to $ZnS_{1-X2}Se_{X2}$ or $CuIn_{1-Y2}Ga_{Y2}(S_{1-X3}Se_{X3})_2$ by controlling a Se composition or applies compressive strain to $GaP_{1-X4}N_{X4}$ by controlling the N composition so as to cancel out tensile strain of $FeS_2$ or $Fe(S_{1-X1}Se_{X1})_2$.

5. The solid-state imaging device according to claim 3, wherein the hetero interface applies tensile strain to $ZnS_{1-X2}Se_{X2}$ or $CuIn_{1-Y2}Ga_{Y2}(S_{1-X3}Se_{X3})_2$ by controlling a Se composition or a Ga composition or applies tensile strain to $GaP_{1-X4}N_{X4}$ by controlling the N composition so as to cancel out the compressive strain of $Fe(S_{1-X1}Se_{X1})_2$.

6. The solid-state imaging device according to claim 1, comprising:
   an electron barrier layer which is provided on the surface side of the MQW structure; and
   an electrode which is arranged on the electron barrier layer.

7. The solid-state imaging device according to claim 6, wherein the electron barrier layer is formed using NiO, $Cu_2O$, or $ZnRh_2O_4$.

8. The solid-state imaging device according to claim 6, wherein the thickness of the electron barrier layer is 10 nm or more.

9. The solid-state imaging device according to claim 1, wherein a hole barrier layer is formed between the silicon substrate and the MQW structure or a hole barrier layer is set by increasing the thickness of the first layer only on the silicon substrate side of the MQW structure.

10. The solid-state imaging device according to claim 9, wherein the hole barrier layer includes any one of ZnS or $ZnS_{1-X2}Se_{X2}$, $CuIn_{1-Y1}Ga_{Y1}S_2$ or $CuIn_{1-Y2}Ga_{Y2}(S_{1-X3}Se_{X3})_2$, or GaP or $GaP_{1-X4}N_{X4}$, and the thickness thereof is 10 nm or more.

11. The solid-state imaging device according to claim 1, wherein an inclined substrate is used as the silicon substrate.

12. The solid-state imaging device according to claim 11, wherein the inclined substrate is a substrate which is inclined in the <011> direction or a synthesis direction of <011> and <0-11>.

13. The solid-state imaging device according to claim 1, which has a structure with separated pixels.

14. The solid-state imaging device according to claim 13, wherein the structure with separated pixels is created by forming a groove by etching a part between pixels of a photoelectric conversion section.

15. The solid-state imaging device according to claim 13, wherein the structure with separated pixels is created by setting a part between the pixels of a photoelectric conversion section to p+.

16. The solid-state imaging device according to claim 13, wherein the structure with separated pixels is created by increasing the resistance of a part between the pixels of the photoelectric conversion section using ion implantation.

17. A light detecting device, comprising:
a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light, wherein the MQW structure has a photoelectron conversion part, and wherein a surface layer of the photoelectron conversion part is p+.

18. The light detecting device according to claim 17, wherein the MQW structure has a Type II hetero interface and a thickness of each layer is set so as to form an inter-sub-band transition.

19. An electronic apparatus comprising:
a solid-state imaging device provided with a Multi-Quantum Wells (MQW) structure which combines and uses a non-Group IV lattice matching-based compound semiconductor with an absolute value of a mismatch ratio of less than 1% on a silicon substrate so as to have sensitivity to at least infrared light, wherein the MOW structure has a photoelectron conversion part, and wherein a surface layer of the photoelectron conversion part is p+;
an optical system which emits incident light to the solid-state imaging device; and
a signal processing circuit which processes an output signal which is output from the solid-state imaging device.

\* \* \* \* \*